US008151161B2

(12) United States Patent
Cho et al.

(10) Patent No.: US 8,151,161 B2
(45) Date of Patent: Apr. 3, 2012

(54) APPARATUS AND METHOD FOR DECODING USING CHANNEL CODE

(75) Inventors: Ki Hyoung Cho, Gyeonggi-do (KR); Min Seok Oh, Seoul (KR); Young Seob Lee, Gyeonggi-do (KR); Ji Wook Chung, Gyeonggi-do (KR)

(73) Assignee: LG Electronics Inc., Seoul (KR)

( * ) Notice: Subject to any disclaimer, the term of this patent is extended or adjusted under 35 U.S.C. 154(b) by 950 days.

(21) Appl. No.: 12/159,083

(22) PCT Filed: Dec. 27, 2006

(86) PCT No.: PCT/KR2006/005763
§ 371 (c)(1),
(2), (4) Date: Jun. 24, 2008

(87) PCT Pub. No.: WO2007/075043
PCT Pub. Date: Jul. 5, 2007

(65) Prior Publication Data
US 2009/0063926 A1 Mar. 5, 2009

(30) Foreign Application Priority Data

Dec. 27, 2005 (KR) .................. 10-2005-0130569
Dec. 30, 2005 (KR) .................. 10-2005-0135352

(51) Int. Cl.
*G06F 11/00* (2006.01)
(52) U.S. Cl. ........................ 714/752; 714/786
(58) Field of Classification Search .............. 714/752, 714/786
See application file for complete search history.

(56) References Cited

U.S. PATENT DOCUMENTS

| 7,730,377 B2* | 6/2010 | Hocevar .................. 714/752 |
| 2004/0148560 A1 | 7/2004 | Hocevar |
| 2005/0235195 A1 | 10/2005 | Choi et al. |
| 2006/0020870 A1* | 1/2006 | Hocevar .................. 714/752 |
| 2006/0195765 A1* | 8/2006 | Coffey .................... 714/760 |
| 2006/0209982 A1* | 9/2006 | De Gaudenzi et al. ..... 375/279 |
| 2008/0288846 A1* | 11/2008 | Kyung et al. ............. 714/752 |
| 2010/0122140 A1* | 5/2010 | Shen et al. .............. 714/752 |
| 2011/0055655 A1* | 3/2011 | Hocevar .................. 714/752 |
| 2011/0167315 A1* | 7/2011 | Kyung et al. ............. 714/752 |

FOREIGN PATENT DOCUMENTS
EP 1531552 A1 5/2005
* cited by examiner

*Primary Examiner* — Marc Duncan
(74) *Attorney, Agent, or Firm* — Lee, Hong, Degerman, Kang & Waimey

(57) ABSTRACT

An apparatus and method for decoding a channel code is disclosed. The method for decoding a channel code includes the steps of receiving a low density parity check (LDPC) encoded signal from a transmitting party, generating a parity check matrix by adjusting the order of rows or columns of the parity check matrix, the parity check matrix including a plurality of groups consisting of a plurality of columns, at least one of the groups including at least one row of which every element is zero (0), and iteratively decoding the received signal for each group by using the generated parity check matrix.

12 Claims, 22 Drawing Sheets

FIG. 7

$$H = \begin{bmatrix} P_{0,0} & P_{0,1} & P_{0,2} & \cdots & P_{0,n_b-2} & P_{0,n_b-2} \\ P_{1,0} & P_{1,1} & P_{1,2} & \cdots & P_{1,n_b-2} & P_{1,n_b-1} \\ P_{2,0} & P_{2,1} & P_{2,2} & \cdots & P_{2,n_b-2} & P_{2,n_b-1} \\ \vdots & \vdots & \vdots & & \vdots & \vdots \\ P_{m_b-1,0} & P_{m_b-1,1} & P_{m_b-1,2} & \cdots & P_{m_b-1,n_b-2} & P_{m_b-1,n_b-1} \end{bmatrix} = P^{H_b}$$

FIG. 8

| 1 | 0 | 0 | 0 | 0 | 0 | 0 | 0 |
|---|---|---|---|---|---|---|---|
| 0 | 1 | 0 | 0 | 0 | 0 | 0 | 0 |
| 0 | 0 | 1 | 0 | 0 | 0 | 0 | 0 |
| 0 | 0 | 0 | 1 | 0 | 0 | 0 | 0 |
| 0 | 0 | 0 | 0 | 1 | 0 | 0 | 0 |
| 0 | 0 | 0 | 0 | 0 | 1 | 0 | 0 |
| 0 | 0 | 0 | 0 | 0 | 0 | 1 | 0 |
| 0 | 0 | 0 | 0 | 0 | 0 | 0 | 1 |

(a)

$\xrightarrow{n_s}$

| 0 | 0 | 0 | 1 | 0 | 0 | 0 | 0 |
|---|---|---|---|---|---|---|---|
| 0 | 0 | 0 | 0 | 1 | 0 | 0 | 0 |
| 0 | 0 | 0 | 0 | 0 | 1 | 0 | 0 |
| 0 | 0 | 0 | 0 | 0 | 0 | 1 | 0 |
| 0 | 0 | 0 | 0 | 0 | 0 | 0 | 1 |
| 1 | 0 | 0 | 0 | 0 | 0 | 0 | 0 |
| 0 | 1 | 0 | 0 | 0 | 0 | 0 | 0 |
| 0 | 0 | 1 | 0 | 0 | 0 | 0 | 0 |

| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 |
|---|---|---|---|---|---|---|---|---|---|---|---|---|---|---|---|---|---|---|---|---|---|---|---|---|
| | 2 | -1 | 19 | -1 | 47 | -1 | 48 | -1 | 36 | -1 | 82 | -1 | 47 | -1 | 15 | -1 | 95 | 0 | -1 | -1 | -1 | -1 | -1 | -1 |
| | -1 | 69 | -1 | 88 | -1 | 33 | -1 | 9 | -1 | 16 | -1 | 37 | -1 | 40 | -1 | 48 | -1 | 0 | 0 | -1 | -1 | -1 | -1 | -1 |
| | -1 | -1 | 86 | -1 | 62 | -1 | 28 | -1 | 85 | -1 | 16 | -1 | 34 | -1 | 73 | -1 | -1 | -1 | 0 | 0 | -1 | -1 | -1 | -1 |
| | -1 | -1 | -1 | 32 | -1 | 81 | -1 | 27 | -1 | 88 | -1 | 5 | -1 | 56 | -1 | 37 | -1 | -1 | -1 | 0 | 0 | -1 | -1 | -1 |
| | -1 | -1 | -1 | -1 | 15 | -1 | 30 | -1 | 66 | -1 | 24 | -1 | 50 | -1 | 62 | -1 | -1 | -1 | -1 | -1 | 0 | 0 | -1 | -1 |
| | -1 | -1 | -1 | -1 | -1 | 54 | -1 | 14 | -1 | 0 | -1 | 30 | -1 | 74 | -1 | 0 | -1 | -1 | -1 | -1 | -1 | 0 | 0 | -1 |
| | 32 | 30 | 0 | 65 | 15 | -1 | 56 | -1 | 85 | -1 | 5 | -1 | 6 | -1 | 52 | -1 | 0 | -1 | -1 | -1 | -1 | -1 | 0 | 0 |
| | -1 | -1 | -1 | -1 | -1 | 13 | -1 | 61 | -1 | 84 | -1 | 55 | -1 | 78 | -1 | 41 | 95 | -1 | -1 | -1 | -1 | -1 | -1 | 0 |

FIG. 11

| | Group 1 | | | | | | | | | | Group 2 | | | | | | | | | Group 3 | | | | | | | | Group 4 | | | | | | |
|---|---|---|---|---|---|---|---|---|---|---|---|---|---|---|---|---|---|---|---|---|---|---|---|---|---|---|---|---|---|---|---|---|---|
| | 0 | 2 | 4 | 6 | 8 | 10 | 1 | 3 | 5 | 7 | 9 | 11 | 12 | 13 | 14 | 15 | 16 | 17 | 18 | 19 | 20 | 21 | 22 | 23 |
| | 2 | 19 | 47 | 48 | 36 | 82 | -1 | -1 | -1 | -1 | -1 | -1 | 47 | -1 | 15 | -1 | 95 | 0 | -1 | -1 | -1 | -1 | -1 | -1 |
| | -1 | -1 | -1 | -1 | -1 | -1 | 69 | 88 | 33 | 3 | 16 | 37 | -1 | 40 | -1 | 48 | -1 | 0 | -1 | -1 | -1 | -1 | -1 | -1 |
| | 10 | 86 | 62 | 28 | 85 | 16 | -1 | -1 | -1 | -1 | -1 | -1 | 34 | 56 | 73 | -1 | -1 | -1 | -1 | -1 | -1 | -1 | -1 | -1 |
| | -1 | -1 | -1 | -1 | -1 | -1 | 28 | 32 | 81 | 27 | 88 | 5 | -1 | -1 | -1 | 37 | -1 | -1 | 0 | 0 | 0 | -1 | -1 | -1 |
| | 23 | 29 | 15 | 30 | 66 | 24 | -1 | -1 | -1 | -1 | -1 | -1 | 50 | -1 | 62 | -1 | -1 | -1 | -1 | 0 | 0 | 0 | -1 | -1 |
| | -1 | -1 | -1 | -1 | -1 | -1 | 30 | 65 | 54 | 14 | 0 | 30 | -1 | 74 | -1 | 0 | -1 | -1 | -1 | -1 | -1 | 0 | 0 | 0 |
| | 32 | 0 | 15 | 56 | 85 | 5 | -1 | -1 | -1 | -1 | -1 | -1 | 6 | -1 | 52 | -1 | 0 | -1 | -1 | -1 | -1 | -1 | 0 | 0 |
| | -1 | -1 | -1 | -1 | -1 | -1 | 0 | 47 | 13 | 61 | 84 | 55 | -1 | 78 | -1 | 41 | 95 | -1 | -1 | -1 | -1 | -1 | -1 | 0 |

FIG. 12

| -1 | -1 | -1 | -1 | -1 | -1 | 0  | 0  |
| -1 | -1 | -1 | -1 | -1 | 0  | 0  | -1 |
| -1 | -1 | -1 | -1 | 0  | 0  | -1 | -1 |
| -1 | -1 | -1 | 0  | 0  | -1 | -1 | -1 |
| -1 | -1 | 0  | 0  | -1 | -1 | -1 | -1 |
| -1 | 0  | 0  | -1 | -1 | -1 | -1 | -1 |
| 0  | 0  | -1 | -1 | -1 | -1 | -1 | -1 |
| 95 | -1 | -1 | -1 | -1 | -1 | 0  | 95 |
| -1 | 48 | -1 | 37 | -1 | 0  | -1 | 41 |
| 15 | -1 | 73 | -1 | 62 | -1 | 52 | -1 |
| -1 | 40 | -1 | 56 | -1 | 74 | -1 | 78 |
| 47 | -1 | 34 | -1 | 50 | -1 | 6  | -1 |
| -1 | 37 | -1 | 5  | -1 | 30 | -1 | 55 |
| 82 | -1 | 16 | -1 | 24 | -1 | 5  | -1 |
| -1 | 16 | -1 | 88 | -1 | 0  | -1 | 84 |
| 36 | -1 | 85 | -1 | 66 | -1 | 85 | -1 |
| -1 | 3  | -1 | 27 | -1 | 14 | -1 | 61 |
| 48 | -1 | 28 | -1 | 30 | -1 | 56 | -1 |
| -1 | 33 | -1 | 81 | -1 | 54 | -1 | 13 |
| 47 | -1 | 62 | -1 | 15 | -1 | 15 | -1 |
| -1 | 88 | -1 | 32 | -1 | 65 | -1 | 47 |
| 19 | -1 | 86 | -1 | 29 | -1 | 0  | -1 |
| -1 | 69 | -1 | 28 | -1 | 30 | -1 | 0  |
| 2  | -1 | 10 | -1 | 23 | -1 | 32 | -1 |

FIG. 13

|    |    |    |    |    |    |    |    |
|----|----|----|----|----|----|----|----|
| -1 | -1 | -1 | -1 | -1 | -1 |  0 |  0 |
| -1 | -1 | -1 | -1 | -1 |  0 |  0 | -1 |
| -1 | -1 | -1 | -1 |  0 |  0 | -1 | -1 |
| -1 | -1 | -1 |  0 |  0 | -1 | -1 | -1 |
| -1 | -1 |  0 |  0 | -1 | -1 | -1 | -1 |
| -1 |  0 |  0 | -1 | -1 | -1 | -1 | -1 |
|  0 |  0 | -1 | -1 | -1 | -1 | -1 | -1 |
| 95 | -1 | -1 | -1 | -1 | -1 |  0 | 95 |
| -1 | 48 | -1 | 37 | -1 |  0 | -1 | 41 |
| -1 | 40 | -1 | 56 | -1 | 74 | -1 | 78 |
| -1 | 37 | -1 |  5 | -1 | 30 | -1 | 55 |
| -1 | 16 | -1 | 88 | -1 |  0 | -1 | 84 |
| -1 |  3 | -1 | 27 | -1 | 14 | -1 | 61 |
| -1 | 33 | -1 | 81 | -1 | 54 | -1 | 13 |
| -1 | 88 | -1 | 32 | -1 | 65 | -1 | 47 |
| -1 | 69 | -1 | 28 | -1 | 30 | -1 |  0 |
| 15 | -1 | 73 | -1 | 62 | -1 | 52 | -1 |
| 47 | -1 | 34 | -1 | 50 | -1 |  6 | -1 |
| 82 | -1 | 16 | -1 | 24 | -1 |  5 | -1 |
| 36 | -1 | 85 | -1 | 66 | -1 | 85 | -1 |
| 48 | -1 | 28 | -1 | 30 | -1 | 56 | -1 |
| 47 | -1 | 62 | -1 | 15 | -1 | 15 | -1 |
| 19 | -1 | 86 | -1 | 29 | -1 |  0 | -1 |
|  2 | -1 | 10 | -1 | 23 | -1 | 32 | -1 |

| -1 | -1 | -1 | -1 | -1 | -1 | 0 | 0 |
|---|---|---|---|---|---|---|---|
| -1 | -1 | -1 | -1 | -1 | 0 | 0 | -1 |
| -1 | -1 | -1 | -1 | 0 | 0 | -1 | -1 |
| -1 | -1 | -1 | 0 | 0 | -1 | -1 | -1 |
| -1 | -1 | 0 | 0 | -1 | -1 | -1 | -1 |
| -1 | 0 | 0 | -1 | -1 | -1 | -1 | -1 |
| 0 | 0 | -1 | -1 | -1 | -1 | -1 | -1 |
| 95 | -1 | -1 | -1 | -1 | -1 | 0 | 95 |
| -1 | 48 | -1 | 37 | -1 | 0 | -1 | 41 |
| -1 | 40 | -1 | 56 | -1 | 74 | -1 | 78 |
| -1 | 37 | -1 | 5 | -1 | 30 | -1 | 55 |
| -1 | 16 | -1 | 88 | -1 | 0 | -1 | 84 |
| -1 | 3 | -1 | 27 | -1 | 14 | -1 | 61 |
| -1 | 33 | -1 | 81 | -1 | 54 | -1 | 13 |
| -1 | 88 | -1 | 32 | -1 | 65 | -1 | 47 |
| -1 | 69 | -1 | 28 | -1 | 30 | -1 | 0 |
| 15 | -1 | 73 | -1 | 62 | -1 | 52 | -1 |
| 47 | -1 | 34 | -1 | 50 | -1 | 6 | -1 |
| 82 | -1 | 16 | -1 | 24 | -1 | 5 | -1 |
| 36 | -1 | 85 | -1 | 66 | -1 | 85 | -1 |
| 48 | -1 | 28 | -1 | 30 | -1 | 56 | -1 |
| 47 | -1 | 62 | -1 | 15 | -1 | 15 | -1 |
| 19 | -1 | 88 | -1 | 29 | -1 | 0 | -1 |
| 2 | -1 | 10 | -1 | 23 | -1 | 32 | -1 |

APPARATUS AND METHOD FOR DECODING USING CHANNEL CODE

CROSS-REFERENCE TO RELATED APPLICATIONS

This application is a national stage application of International Application No. PCT/KR2006/005763, filed on Dec. 27, 2006, which claims the benefit of earlier filing date and right of priority to Korean Application No. 10-2005-0130569, filed on Dec. 27, 2005, and Korean Application No. 10-2005-0135352, filed on Dec. 30, 2005.

TECHNICAL FIELD

The present invention relates to an encoding and decoding method, and more particularly, to a method and apparatus for encoding and decoding a low density parity check (LDPC) code, in which complexity of hardware is reduced and performance of encoding and decoding is improved.

BACKGROUND ART

An encoding method using an LDPC code has recently attracted attention. The LDPC code has a parity check matrix H of which most of elements are '0,' and was proposed as a liner block code of low density by Gallager in 1962. However, the LDPC code could not have been realized due to its complexity by the technology at the time when the LDPC code had been proposed. As the LDPC code has been rediscovered in 1995 and its excellent performance has been proved, its studies have been actively made. (References: [1] Robert G. Gallager, "Low-Density Parity-Check Codes", The MIT Press, Sep. 15, 1963. [2] D. J. C. Mackay, Good error-correcting codes based on very sparse matrices, IEEE Trans. Inform. Theory, IT-45, pp. 399-431 (1999))

An encoding method using an LDPC code will be described as below. In a general LDPC encoding method, a generation matrix G is introduced from an LDPC parity check matrix H to encode an information bit. In order to introduce the generation matrix G, $[P^T:I]$ is obtained by Gaussian Reduction of the LDPC parity check matrix H. Supposing that the number of information bits is k and the bit size of a codeword is n, the matrix P has a row size of k and a column size of n-k, and the matrix I is an identity matrix having a row size of k and a column size of k. Supposing that the matrix H is expressed as $[P^T:I]$, the matrix G becomes $[I:P]$. Supposing that an information matrix indicating the information bit of k bit to be encoded is x (matix having a row size of 1 and a column size of k), the encoded codeword c is as follows.

$$c = xG = [x:xP]$$

A decoding method using an LDPC code will be described as below. In a decoding block of a receiving terminal, the information bit x is obtained from the codeword c by using $cH^T=0$, wherein the codeword c results from decoding of a transmitting terminal. In other words, supposing that the received codeword is c', a value of $c'H^T$ is calculated. As a result, if the resultant value of c'HT is 0, first k bits of c' are determined as the decoded information bits. If the resultant value of $c'H^T$ is not 0, c' of which $c'H^T$ satisfies 0 is found by using a sum-product algorithm through a graph, a belief propagation algorithm, and so on, so as to recover x.

FIG. 1 illustrates a bipartite graph used in a decoding process using an LDPC code. Referring to FIG. 1, it is noted how a multivariable global function is factorized by the product of local functions. The bipartite graph includes a check node for parity check and a variable node representing information word symbol or codeword symbol. The decoding process using a decoding algorithm on the bipartite graph includes the following three unit process steps:

1) first step: update of probability value from a check node to a variable node (check-to-variable $\beta_{i,j}$): $\beta_{i,j}$ is a probability value updated from the ith check node to the jth variable node;

2) second step: update of probability value from a variable node to a check node (variable-to-check $\alpha_{i,j}$): $\alpha_{i,j}$ is a probability value updated from the ith variable node to the jth check node; and 3) third step: determination of a decoding value through probability of a variable node.

The decoding process using the LDPC code in a receiving party includes determining a value obtained by the equation $c \cdot H^T=0$ as the decoded value if $c \cdot H^T=0$ is satisfied in the third step after the first step and the second step, and iterates the first step and the second step until a given end condition is satisfied if $c \cdot H^T=0$ is not satisfied. The probability value update process in the first step and the second step is performed in such a manner that each update process is iterated by the number of '1' belonging to each row or column of the parity check matrix. As the update process in the first step and the second step is iterated, reliability of the probability value between the check node and the variable node is improved, and, as a result, the probability value is approximated to a true value of the codeword to be obtained. In this case, a ratio between a probability $p_0$ of a specific bit '0' of received information and a probability $p_1$ of a specific bit '1' thereof may be expressed by using log. Such a ratio is referred to as a log-likelihood ratio (LLR) expressed by the following equation 1.

$$LLR = \Lambda(p_0, p_1) = \ln(p_0/p_1) \quad \text{[Equation 1]}$$

For example, if the first step and the second step are applied to a belief propagation algorithm, which is well known, by using the log-likelihood ratio, the following equations 2 and 3 can be obtained. In other words, two input messages $(\Lambda_1, \Lambda_2)$ mean that $CHK(\Lambda_1, \Lambda_2)$ in the equation 2 are probability values updated from the check node to the variable node while $VAR(\Lambda_1, \Lambda_2)$ in the equation 3 are probability values updated from the variable node to the check node.

$$\begin{aligned}CHK(\Lambda_1, \Lambda_2) &= \ln(\cosh((\Lambda_1 + \Lambda_2)/2)) - \\ &\quad \ln(\cosh((\Lambda_1 - \Lambda_2)/2)) \\ &= 2\tanh^{-1}(\tanh(\Lambda_1/2) \cdot \tanh(\Lambda_2/2))\end{aligned} \quad \text{[Equation 2]}$$

$$VAR(\Lambda_1, \Lambda_2) = \Lambda_1 + \Lambda_2 \quad \text{[Equation 3]}$$

As described above, although proper performance can be obtained by the BP algorithm, if ln(cos h( )) function or tan h( ) function is used as it is, a problem relating to complicated calculation is caused. Accordingly, in practical algorithm, values of ln(cos h( )) function or tan h( ) function are stored using a look-up table and then required values are read out during the next calculation. As a method for reducing a required memory without using a look-up table, there is a min-sum algorithm which is a representative approximation function. The min-sum algorithm obtains the following equation 4 by using a property where the function ln(cosh(x)) is converged into |x|−ln2 in the range of x>>1.

$$CHK(\Lambda_1, \Lambda_2) \approx |(\Lambda_1+\Lambda_2)/2| - |(\Lambda_1-\Lambda_2)/2| = \text{sgn}(\Lambda_1)\text{sgn}(\Lambda_2)\min(|\Lambda_1|, |\Lambda_2|) \quad \text{[Equation 4]}$$

Since the min-sum algorithm according to the equation 4 requires simple comparison calculation and message code check calculation, a look-up table for calculation is not required, and very fast calculation can be performed. FIG. 2 illustrates a comparison result between an ideal function value and a function value obtained by the conventional min-sum algorithm.

Various methods are used to realize a decoder using the aforementioned LDPC code. Examples of the methods include using an approximation equation and using a look-up table on a memory. If the look-up table is used to realize a decoder, a problem occurs in that more memories are required to obtain a more precise approximation value.

In case of the conventional min-sum algorithm which approximates a linear function without using the look-up table, $|x|-\ln 2$ is used for the whole range so that an approximate value may be obtained in the range of $1 \ll |x|$. However, a problem occurs in that a considerable error occurs if a value of $|x|$ is near to 1 or within the range of 1 as shown in FIG. 2.

FIG. 3 to FIG. 5 illustrate another conventional art that can solve the above problem. The conventional art was filed and registered with the Korean Intellectual Property Office by the applicant of the present invention (Korean Patent Application No. 10-2002-0034987).

Referring to FIG. 3 to FIG. 5, the whole variable range is divided into a plurality of ranges so that a linear function, which can approximate to a nonlinear function, may be selected for each range in order to obtain a function value, whereby the problem of the conventional art can be solved, in which a considerable error occurs when the value of $|x|$ is near to 1 or within the range of 1. In FIG. 3 to FIG. 5, a linear function $|x|-\ln 2$ is used in a range where an absolute value of the variable is great while a linear function whose constant value or slope is not 1 is used in the other ranges as a linear function for approximating to the nonlinear function.

In FIG. 4, a linear function $0.40625|x|$ is used in a range of $|x|<1.185$. In FIG. 6, a linear function $0.71875(|x|-0.404)+0.398$ is used in a range of $0.404<|x|<1.602$. Thus, such linear functions are approximated to the original non-linear function $\ln(\cosh(x))$, so that the maximum error from the original function may be reduced. In this case, although better performance can be obtained in comparison with the min-sum algorithm, multiplication is required in the process of obtaining the function values because the slope is not 1. For this reason, a problem occurs in that complexity and calculation amount increase.

Meanwhile, for recent LDPC encoding, a method for encoding input data by using the parity check matrix H without using the generation matrix G is generally used. Accordingly, the parity check matrix H may be the most important factor in the encoding method using an LDPC code, as described above. Since the parity check matrix H has a size more than 1000×2000, problems occur in that the parity check matrix H requires much calculation in the encoding and decoding processes, is accompanied with complexity in its application, and requires a lot of storage areas.

DISCLOSURE OF THE INVENTION

Accordingly, the present invention is directed to a method and apparatus for encoding and decoding a low density parity check (LDPC) code, in which the LDPC code is encoded and decoded by using a parity check matrix easy for parallel processing decoding.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method for decoding signals by using a channel code according to the present invention includes the steps of receiving signals encoded by a low density parity check (LDPC) code from a transmitting party, generating a parity check matrix by adjusting the order of rows or columns of the parity check matrix, the parity check matrix including a plurality of groups consisting of a plurality of columns, at least one of the groups including at least one row of which every element is zero (0), iteratively decoding the received signals for each group by using the generated parity check matrix.

In another aspect of the present invention, an apparatus for decoding signals by using a channel code includes a receiving module receiving signals encoded by an LDPC code from a transmitting party, a parity check matrix generation module generating a parity check matrix by adjusting the order of rows or columns of the parity check matrix, the parity check matrix including a plurality of groups consisting of a plurality of columns, at least one of the groups including at least one row of which every element is zero (0), a decoding module iteratively decoding the received signals for each group by using the generated parity check matrix.

In still another aspect of the present invention, in a parity check matrix for channel encoding and decoding, which is used for LDPC encoding of a transmitting signal and LDPC decoding of a received signal, the parity check matrix includes a plurality of groups consisting of at least two columns, and is generated by adjusting the order of rows or columns of a parity check matrix which is previously set, wherein at least one group includes at least one row of which every element is zero (0).

In still another aspect of the present invention, a method for encoding data by using a channel code includes the steps of generating a parity check matrix by adjusting the order of rows or columns of the parity check matrix, the parity check matrix including a plurality of groups consisting of a plurality of columns, at least one of the groups including at least one row of which every element is zero (0), encoding data to be transmitted, by using the generated parity check matrix, and transmitting the encoded signal to a receiving party.

In still another aspect of the present invention, an apparatus for encoding a channel code includes a parity check matrix generation module generating a parity check matrix by adjusting the order of rows or columns of the parity check matrix, the parity check matrix including a plurality of groups consisting of a plurality of columns, at least one of the groups including at least one row of which every element is zero (0), an encoding module LDPC encoding data to be transmitted, by using the generated parity check matrix, and a transmitting module transmitting the encoded signal to a receiving party.

Another embodiment of the present invention discloses a precise approximation method of a range other than $|x| \gg 1$ to improve performance degradation of a min-sum algorithm. In other words, according to another embodiment of the present invention, the min-sum algorithm or its similar method is used in the range of $|x| \gg 1$ where a function value passes a linear range, and if a value of $|x|$ is near 1 or within 1, a more precise approximation function or value is used, thereby obtaining improved performance. In a range other than $|x|\gg1$, in which an accurate value can be obtained by $|x|-\ln2$ or its similar value, additional linear function is required for approximation. For approximation of a range other than $|x|\gg1$ through additional linear function, a slope may not be equal to 1. Considering that approximation is required due to complexity of function calculation, additional function should be provided as simple as possible in view of its application. Accordingly, it is preferably required that the number of additional functions should be small, application of additional function should be simple, and performance degradation should little occur even in case of quantization.

In still another aspect of the present invention, in a method for decoding an LDPC code, which includes updating a probability value to decode data encoded by the LDPC code, the method includes the steps of acquiring variable values by calculating two input messages, calculating a function value of each variable value in accordance with a linear function of a range to which each variable value belongs, by using a linear function for each range, which is selected to approximate to a specific nonlinear function, each range being obtained by dividing the whole variable range into three or more parts, and updating the probability value by using the calculated function values, wherein the linear function in a specific range corresponding to $|x|<a$ is $b|x|+d$ (b and d are constants) and b is an integer index of 2 ($2^m$, m is an integer).

In still another aspect of the present invention, an apparatus for decoding data encoded by an LDPC code includes an acquisition means acquiring variable values by calculating two input messages, a calculation means calculating a function value of each variable value in accordance with a linear function of a range to which each variable value belongs, by using a linear function for each range, which is selected to approximate to a specific nonlinear function, each range being obtained by dividing the whole variable range into three or more parts, and a probability value update means updating a probability value by using the calculated function values, wherein the linear function in a specific range corresponding to $|x|<a$ is $b|x|+d$ (b and d are constants) and b is an integer index of 2 ($2^m$, m is an integer).

In the preferred embodiment of the present invention, a linear function in a range of $|x|\geq a$ is $|x|-c$ (a and c are constants which are not zero), and c is a number, which is the nearest to $\ln2$, among numbers that can be expressed by n bits when n bits are used for quantization. Preferably, d is a number, which is the nearest to the function value of the nonlinear function, among numbers that can be expressed by n bits when n bits are used for quantization.

As described above, a decoding process using a decoding algorithm on a bipartite graph shown in FIG. 1 includes a first step of updating a probability value from a check node to a variable node, a second step of updating of a probability value from a variable node to a check node, and a third step of determining a decoding value through probability of a variable node. Also, if $c\cdot H^T=0$ is satisfied in the third step after the first step and the second step, a value obtained by the equation $c\cdot H^T=0$ is determined as the decoded value, and if $c\cdot H^T=0$ is not satisfied, the first step and the second step are iterated until a given end condition is satisfied.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 7 illustrates a base matrix comprised of a plurality of permutation matrices or zero matrices of dimension z×z;

FIG. 8 illustrates a method for shifting all the rows (or columns) of a base permutation matrix at constant intervals in accordance with the present invention;

FIG. 9 illustrates an example of a parity check matrix divided for the unit of group;

FIG. 10 illustrates an example of a general parity check matrix using the base matrix;

FIG. 11 illustrates an example of a parity check matrix using the base matrix in accordance with one embodiment of the present invention;

FIG. 12 illustrates an example of a general parity check matrix using the base matrix;

FIG. 13 illustrates an example of a parity check matrix divided into four groups in accordance with one embodiment of the present invention;

FIG. 14 illustrates an example of a general parity check matrix divided into six groups;

FIG. 15 illustrates an example of a parity check matrix divided into six groups in accordance with one embodiment of the present invention;

BEST MODE FOR CARRYING OUT THE INVENTION

Figure 6A:
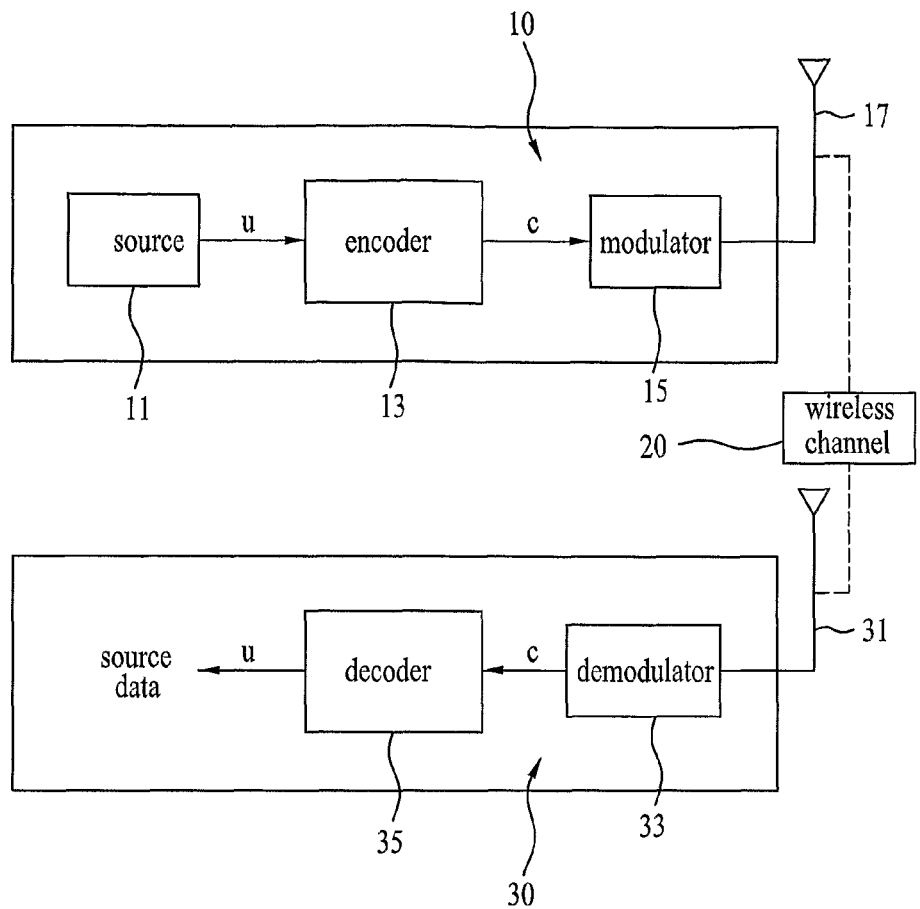
FIG. 6A illustrates an example of technical features according to the present invention, which are applied to a mobile communication system.

Hereinafter, reference will now be made in detail to an encoding method using a low density parity check (LDPC) code according to the preferred embodiments of the present invention, examples of which are illustrated in the accompanying drawings. FIG. 6A illustrates an example of technical features according to the present invention, which are applied to a mobile communication system. It will be apparent to those skilled in the art that the embodiments described hereinafter are only exemplary to describe features of the present invention and that technical features of the present invention can be applied to all the fields that require encoding or decoding.

In FIG. 6A, a transmitter 10 and a receiver 30 perform communication through a wireless channel 20. In the transmitter 10, source data "u" of k bit output from a data source 11 becomes a codeword "c" of n bit through LDPC encoding of an LDPC encoder 13. The codeword "c" is wireless-modulated by a modulator 15, transmitted through an antenna 17, and received to an antenna 31 of the receiver 30 through the wireless channel 20. The receiver 30 undergoes reverse process steps with respect to the process steps of the transmitter 10. In other words, in the receiver 30, received data are demodulated by a demodulator 33 and decoded by an LDPC decoder 35 to finally obtain source data "u." It will be apparent that the aforementioned data transmission and reception process steps have been described within the required minimum range to describe features of the present invention and other various process steps are required for data transmission.

Figure 6B:
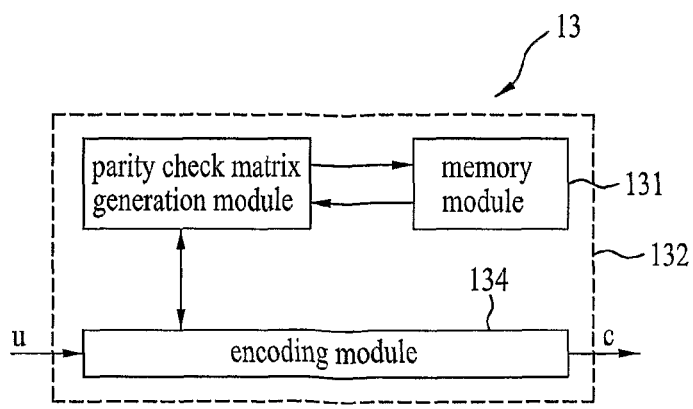
FIG. 6B illustrates an example of technical features according to the present invention, which are applied to an encoding apparatus.

FIG. 6B illustrates an LDPC encoding module according to the present invention. The parity check matrix "H," which the LDPC encoding module 13 uses to encode the input source data, has a dimension of (n−k)×n. In this case, "k" denotes the length (in bits) of the source data input to the LDPC encoding module 13 and "n" denotes the length (in bits) of the encoded codeword "c." As shown in FIG. 7, the parity check matrix "H" includes a plurality of permutation matrices or zero matrices of dimension z×z. In FIG. 7, "$P_{i,j}$" denotes a permutation or zero matrix of dimension z×z.

The plurality of permutation matrices are formed by shifting at least one base permutation matrix according to a specific rule. Preferably, the base permutation matrix is an identity matrix. The plurality of permutation matrices including the at least one base permutation matrix preferably have rows and columns of which weight is "1." In other words, it is preferable that only one element of each row of the plurality of permutation matrices and only one element of each column thereof are "1" and the other elements are all "0."

In one embodiment, a method for shifting all the rows (or columns) of the base permutation matrix at constant intervals is considered as a specific rule to form the plurality of permutation matrices by shifting the at least one base permutation matrix. FIG. 8 illustrates an example of this method. Referring to FIG. 8, a permutation matrix of FIG. 8B is formed by shifting each row of a base permutation matrix of FIG. 8A downwards by 5 rows (i.e., $n_s$=5) (or by shifting each column to the right by 3 columns). In this method, z−1 number of permutation matrices can be formed by intervals of rows (or columns) shifted with respect to the base permutation matrix of dimension z×z, whereby a total of z number of permutation matrices including the base permutation matrix are formed. Given the base permutation matrix, each of the z number of permutation matrices including the base permutation matrix can be expressed by a single integer. For example, each of the permutation matrices can be expressed by a single integer in such a manner that the base permutation matrix is expressed by "0," a permutation matrix obtained by shifting each row of the base permutation matrix by one row is expressed by "1," a permutation matrix obtained by shifting each row of the base permutation matrix by two rows is expressed by "2," and so on.

As described above, the type of each of the plurality of permutation matrices formed from the base permutation matrix can be expressed simply by a single integer according to the number of shifted rows (or columns). It will be apparent that the method of expressing the type of plurality of permutation matrices by a single integer is only illustrative and the type of each of the permutation matrices may be expressed by other methods.

According to the present invention, the types of the at least one base permutation matrix and the plurality of permutation matrices formed by shifting each row (or column) of the at least one base permutation matrix by a certain interval are stored in a base matrix $H_b$, and then, the parity check matrix H is generated using the at least one base permutation matrix and the base matrix $H_b$ whenever encoding or decoding is needed at the transmitting party or the receiving party, whereby encoding or decoding is performed using the generated parity check matrix H. As shown in FIG. 6B, the LDPC encoder according to one embodiment of the present invention includes a memory module 131, a parity check matrix generation module 132, and an encoding module 134. The memory module 131 stores the base permutation matrix and the base matrix. The parity check matrix generation module 132 generates the parity check matrix using the base permutation matrix and the base matrix stored in the memory module 131. The encoding module 134 encodes input source data by using the parity check matrix generated by the parity check matrix generation module 132. It will be apparent to those skilled in the art that the parity check matrix generation module 132 and the encoding module 134 can be implemented in software or hardware according to their functions.

When the base matrix $H_b$ is considered as having a form of $[H_d|H_p]$ that is divided into two parts $H_d$ and $H_p$, it is desirable that a block dual diagonal matrix be used for the $H_p$ part. However, the present invention is not limited to this matrix form. The block dual diagonal matrix is a matrix where all elements of a main diagonal and a diagonal below or above the main diagonal are identity matrices and the other elements are zero matrices. If the part $H_p$ is in the form of a block dual diagonal matrix, the part $H_p$ has a column of weight 1. To avoid this, it is preferable that one or two zero matrices be replaced with identity matrices.

Hereinafter, a method for decoding an LDPC code using the aforementioned base matrix $H_b$ will be described. Although the method for decoding an LDPC code will be described based on the base matrix $H_b$ for convenience of description, decoding according to the present invention is not limited to the base matrix. In other words, the parity check matrix may not be generated from the base matrix but be acquired through a specific module or algorithm included inside or outside a decoder. Accordingly, there is no limitation in generating the parity check matrix.

The conventional method for decoding an LDPC code is typically performed by iterating a probability value update procedure between check and variable nodes on a bipartite graph, which is another expression of the parity check matrix, to improve the reliability of the probability values. The method for decoding an LDPC code using the bipartite graph, which is another expression of the parity check matrix, determines a codeword based on the updated probability values. Therefore, the probability value update procedure has a direct influence on the performance of the decoder.

The reliability update procedure can be considered as being mainly divided into a check-to-variable node probability value update process and a binary-to-check node probability value update process. When either the check-to-variable node probability value update or the binary-to-check node probability value update is performed, the probability value of a given element of the parity check matrix is updated using probability values of other elements in the same column or row. At this time, the more reliable results (i.e., the more positive effects) will be given to the decoder depending on how many times the probability values have been updated.

A method for decoding an LDPC code, which exerts more positive effects on the decoder, will now be described. In one embodiment of the present invention, shuffled decoding is used for the method for decoding an LDPC code, which exerts the positive effects on the decoder. For the shuffled decoding, columns of the parity check matrix H used for encoding and decoding the LDPC codes are divided into several groups, so that iterative decoding may be performed. In the same manner as general decoding for an LDPC code, the shuffled decoding may be performed through the probability value update between the check node and the variable node on the bipartite graph. However, the shuffled decoding is characterized in that the probability value update is performed for the unit of the divided groups when the check-to-variable node probability value update is performed.

Figure 9:
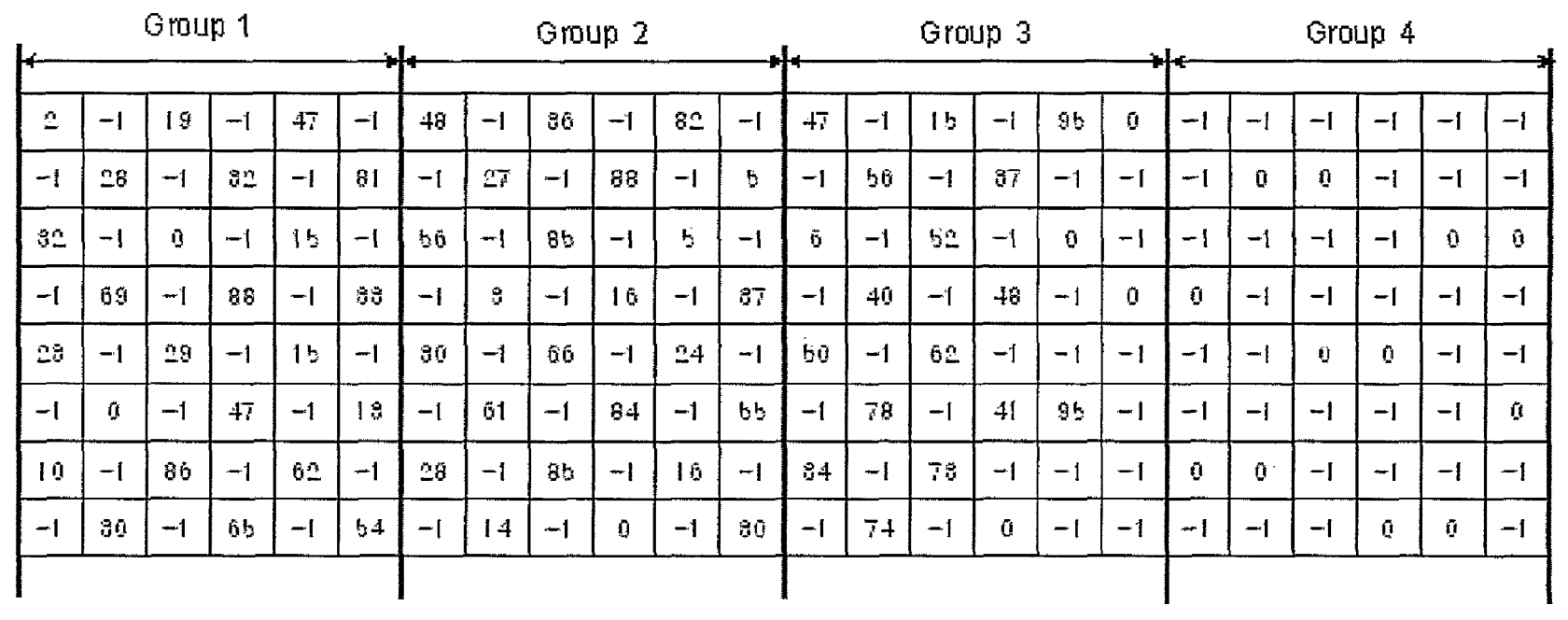

In the case that calculation for the probability value update of the next group is performed after the probability value has been updated by calculation for one group, the probability value of the next group is updated using the probability value calculated by the one group, whereby more reliable probability value is used for decoding, i.e., probability value update. In other words, in the check-to-variable node probability value update procedure, the probability values, which have been previously updated, are not used uniformly but updated for each group. If the probability value update is iterated in this way, more reliable probability value is used for the next probability value update. This increases the reliability of probability values between the check node and the variable node, thereby improving the performance of the decoder. FIG. 9 illustrates an example of the parity check matrix divided for each group. The matrix shown in FIG. 9 is an example of the base matrix for illustrating the shuffled decoding, wherein "−1" denotes a zero matrix and integers more than "0" denote shift numbers.

The shuffled decoding has the aforementioned advantages but may require much more calculation than that of the LDPC decoder based on a conventional algorithm in view of practical implementation. The decoder according to the conventional LDPC decoding algorithm has the same calculation amount as that of the decoder for the shuffled decoding in view of algorithm. However, the conventional LDPC decoder can use the algorithm in the form of reducing the calculation amount, whereas the decoder for the shuffled decoding cannot use the algorithm in the form of reducing the calculation amount in view of its characteristic and, for this reason, may require relatively much more calculation amount. A standard belief propagation (BP) algorithm which is one of the algorithms for decoding an LDPC code is as follows.

Initialization: Set i=1, maximum number of iterations to $I_{Max}$. For each m, n, set $z_{mn}^{(0)}=F_n$.

Step 1:

a) Horizontal Step, for $1 \leq n \leq N$ and each in $\in M(n)$, process $$\tau_{mn}^{(i)} = \prod_{n' \in N(m) \backslash n} \tanh\left(\frac{z_{mn'}^{(i-1)}}{2}\right) \quad (1)$$

$$\varepsilon_{mn}^{(i)} = \log \frac{1+\tau_{mn}^{(i)}}{1-\tau_{mn}^{(i)}}. \quad (2)$$

b) Vertical Step, for $1 \leq n \leq N$ and each m∈M(n), process $$z_{mn}^{(i)} = F_n + \sum_{m' \in M(n) \backslash m} \varepsilon_{m'n}^{(i)} \quad (3)$$

$$z_n^{(i)} = F_n + \sum_{m \in M(n)} \varepsilon_{m'n}^{(i)} \quad (4)$$

Step 2: Hard decision and stopping criterion test a) Create $\hat{w}^{(i)}=[\hat{w}_n^{(i)}]$ such that $\hat{w}_n^{(i)}=0$ if $z_n^{(i)}>0$, and $\hat{w}_n^{(i)}=1$ if $z_n^{(i)}<0$.

b) If $H\hat{w}^{(i)}=0$ of the maximum iteration number $I_{max}$ is reached, stop the decoding iteration and go to Step 3. otherwise, set i:=i+1 and go to Step 1.

Step 3: Output $\hat{w}^{(i)}$ and the decoded codeword.

The above algorithm includes an initialization step for variable setting for iterative decoding, a probability value update step (Step 1) including a check node update step (horizontal step) and a variable node update step (vertical step), a hard decision step (Step 2) on the basis of the updated probability value, and an output step (Step 3) of the decision value. The following equation is used for the above algorithm.

H: parity check matrix $M(n)=\{m|H_{mn}=1\}$: sum of check node connected to the $n_{th}$ variable node $N(m)=\{n|H_{mn}=1\}$: sum of variable node connected to the $m_{th}$ check node $z_{mn}^{(i)}$: log likelihood ratio (LLR) value connected from the $n_{th}$ variable node to the $m_{th}$ check node by the $i_{th}$ iteration $z_n^{(i)}$ posterior LLR value of the $n_{th}$ variable node by the $i_{th}$ iteration $\varepsilon_{mn}^{(i)}$ LLR value updated from the $m_{th}$ check node to the $n_{th}$ variable node by the $i_{th}$ iteration $\tau_{mn}^{(i)}$: dummy variable for calculating LLR value updated from the $m_{th}$ check node to the $n_{th}$ variable node by the $i_{th}$ iteration m: check node index of parity check matrix (i.e., m denotes a number of row.)

n: variable node index of parity check matrix (i.e., j denotes a number of column.)

In the case that the received signal is decoded through the aforementioned LDPC decoding algorithm, in order to obtain $\tau_{mn}^{(i)}$ in the check node update step (horizontal step) of the probability value update step (Step 1), calculation such as $$\tau_{mn}^{(i)} = \left(\prod_{n' \in N(m)} \tanh\left(\frac{z_{mn'}^{(i-1)}}{2}\right)\right) \Big/ \tanh\frac{z_{mn}^{(i-1)}}{2}$$

should be obtained. In practical implementation of the decoder, $$\prod_{n' \in N(m)} \tanh\left(\frac{z_{mn'}^{(i-1)}}{2}\right)$$

is not calculated whenever the check node update is performed but its calculation is reduced using the previously calculated value. Since $$\prod_{n' \in N(m)} \tanh\left(\frac{z_{mn'}^{(i-1)}}{2}\right)$$

includes index calculation and product calculation, of which calculation is relatively more than any other calculation for probability value update, the calculation amount can considerably be reduced if $$\prod_{n' \in N(m)} \tanh\left(\frac{z_{mn'}^{(i-1)}}{2}\right)$$

is processed using the previously calculated value.

Although the decoder for the shuffled decoding can reduce the calculation amount using the aforementioned method, its calculation amount may increase in proportion to the number of groups for the parity check matrix due to its intrinsic characteristic. Decoding complexity $X_{SD}$, i.e., complexity of calculation, of the decoder for the shuffled decoding can be expressed as follows.

$$X_{BP} <= X_{SD} <= g \, X_{BP}$$

In other words, decoding complexity $X_{SD}$ of the decoder for the shuffled decoding becomes more complicated than decoding complexity $X_{BP}$ of the conventional decoding method. In worst case, a problem may occur in that decoding complexity $X_{SD}$ increases linearly in proportion to the number g of the groups.

One embodiment of the present invention suggests a design method of the parity check matrix, which reduces the decoding complexity. Since the shuffled decoding first and iteratively decodes a reliable decoding message value in performing check node update, excellent decoding accuracy can be obtained. However, the shuffled decoding has a problem in that complexity increases in view of complexity of calculation. In one embodiment of the present invention, the parity check matrix and the decoding method using the same are provided to reduce complexity of calculation.

Hereinafter, the case where the shuffled decoding is performed using a general parity check matrix and the case where the shuffled decoding is performed using the parity check matrix according to one embodiment of the present invention will be described in comparison with each other with reference to FIGS. 10 and 11.

FIG. 10 illustrates an example of the general parity check matrix using the base matrix. In FIG. 10, "−1" denotes a zero matrix, integers more than "0" denote shift numbers, and each column of the base matrix is divided by indexes of 0 to 23. FIG. 11 illustrates an example of the parity check matrix using the base matrix in accordance with one embodiment of the present invention. In FIG. 11, "−1" denotes a zero matrix, and integers more than "0" denote shift numbers. The parity check matrix shown in FIG. 11 is divided into four groups, and the decoder according to this embodiment sequentially and iteratively decodes the received signal for each of four groups. Shaded portions in FIG. 11 are represented by integers more than "0" and denote permutation matrices having a weight (weight of row or column) of at least 1. The other portions, which are not shaded, are represented by "−1" and denote zero matrices. Accordingly, the other portions, which are not shaded, denote zones where a weight does not exist. In one embodiment of the present invention, the LDPC decoding method is provided, which maintains performance corresponding to general shuffled decoding and minimizes the calculation amount by using the parity check matrix in the form of FIG. 11. If decoding is performed using the parity check matrix of FIG. 11, the number of the portions which are not shaded increases greatly in comparison with the parity check matrix of FIG. 10 to reduce complexity of calculation.

If the shuffled decoder is actually implemented as described above, the calculation equation such as $$\prod_{n' \in N(m)} \tanh\left(\frac{z_{mn'}^{(i-1)}}{2}\right),$$

which requires complicated calculation, is not calculated whenever the check node update is performed, but the algorithm which uses the previously calculated value is used. If the shuffled decoder uses the algorithm which reduces the calculation amount, the shuffled decoder decodes the received signal using the general parity check matrix shown in FIG. 10 to increase the calculation amount. For example, if the parity check matrix of FIG. 10 is divided into four groups, there little exist portions where only zero matrices exist in a row inside four groups. Accordingly, if the probability value for the received signal is updated using the parity check matrix of FIG. 10, $$\prod_{n' \in N(m)} \tanh\left(\frac{z_{mn'}^{(i-1)}}{2}\right)$$

should newly be calculated whenever check node update for each group is performed. However, if the received signal is decoded using the parity check matrix of FIG. 11 according to one embodiment of the present invention, there exist a plurality of portions where only zero matrices exist in a row inside a specific group. Accordingly, if the probability value for the received signal is updated using the parity check matrix of FIG. 11, no weight exist in the portions where only zero matrices exist in a row, whereby it is not necessary to newly calculate $$\prod_{n' \in N(m)} \tanh\left(\frac{z_{mn'}^{(i-1)}}{2}\right).$$

The parity check matrix of FIG. 11 includes a certain number of zero matrices in a row. Also, the number of zero matrices formed in a row is preferably determined depending on the size of each of the groups divided for the shuffled decoding. For example, the parity check matrix of FIG. 11 is divided into four groups of the same size, wherein one group is comprised of a row having a size corresponding to 6 (however, size is variable depending on a size of each permutation matrix constituting the base matrix of FIG. 11). Accordingly, the number of zero matrices successively formed in a row is preferably 6.

The parity check matrix as shown in FIG. 11 may be generated by various methods. For example, the parity check matrix according to this embodiment may be generated through information stored in a memory device provided inside or outside the decoder in the forms of FIG. 11. Alternatively, the parity check matrix according to this embodiment may be generated using the general parity check matrix of FIG. 10. Hereinafter, an example of a method for generating the parity check matrix according to this embodiment using the general parity check matrix will be described. Indexes of a column of the parity check matrix shown in FIG. 10 may be adjusted in the order of 0->2->4->6->8->10->1->3->5->7->9->11->12->13->14->15->16->17->18->19->20->21->22->23 to obtain the parity check matrix of FIG. 11. Accordingly, the signal generated by the encoder, which uses the parity check matrix of FIG. 10, can be received by the decoder which uses the parity check matrix of FIG. 11. The codeword generated by LDPC encoding performed using the parity check matrix of FIG. 10 is different from that generated by LDPC encoding performed using the parity check matrix of FIG. 11. Accordingly, in order to decode the signal generated in the encoder which uses the parity check matrix of FIG. 10, the signal is decoded using the decoder which uses the parity check matrix of FIG. 11 and the decoded result should be readjusted in accordance with the rule in which the order of the columns is adjusted.

FIG. 12 to FIG. 15 illustrate the difference in complexity of calculation if the received signal is decoded using the general parity check matrix and the parity check matrix according to the embodiment of the present invention. Hereinafter, complexity of calculation of the parity check matrix according to one embodiment of the present invention will be described with reference to the accompanying drawings.

In FIG. 12, the general parity check matrix is divided into four groups. FIG. 12 illustrates an example of the general parity check matrix using the base matrix. Referring to FIG. 12, shaded portions represent that at least one component having a weight exists in a row within each group divided into four parts. The other portions which are not shaded represent that at least one component having no weight, i.e., only zero matrices exist in a row within each group divided into four parts. If the parity check matrix of FIG. 12 is divided into four groups having six row components, only one portion corresponding to zero matrices exists in a row within each group. If a single row having six components is referred to as a set, the one group is comprised of eight sets while the whole parity check matrix is comprised of thirty-two sets. As described above, since the shuffled decoding performs check node update for each group, if the received signal is decoded using the parity check matrix of FIG. 12, the complicated calculation such as $$\prod_{n' \in N(m)} \tanh\left(\frac{z_{mn'}^{(i-1)}}{2}\right)$$

is required for thirty-one sets of a total of thirty-two sets.

FIG. 13 illustrates an example of the parity check matrix according to one embodiment of the present invention, which is divided into four groups. Referring to FIG. 13, shaded portions represent that at least one component having a weight exists in a row within each group divided into four parts. The other portions which are not shaded represent that at least one component having no weight, i.e., only zero matrices exist in a row within each group divided into four parts. If the parity check matrix of FIG. 13 is divided into four groups having six row components, there exist seven portions where components of each matrix correspond to zero matrices in a row within each group. Accordingly, if the received signal is decoded using the parity check matrix of FIG. 13, the complicated calculation such as $$\prod_{n' \in N(m)} \tanh\left(\frac{z_{mn'}^{(i-1)}}{2}\right)$$

is required for twenty-five sets of a total of thirty-two sets. As a result, it is noted that decoding based on the parity check matrix according to one embodiment of the present invention is more advantageous than decoding based on the general parity check matrix of FIG. 12.

Figure 14:
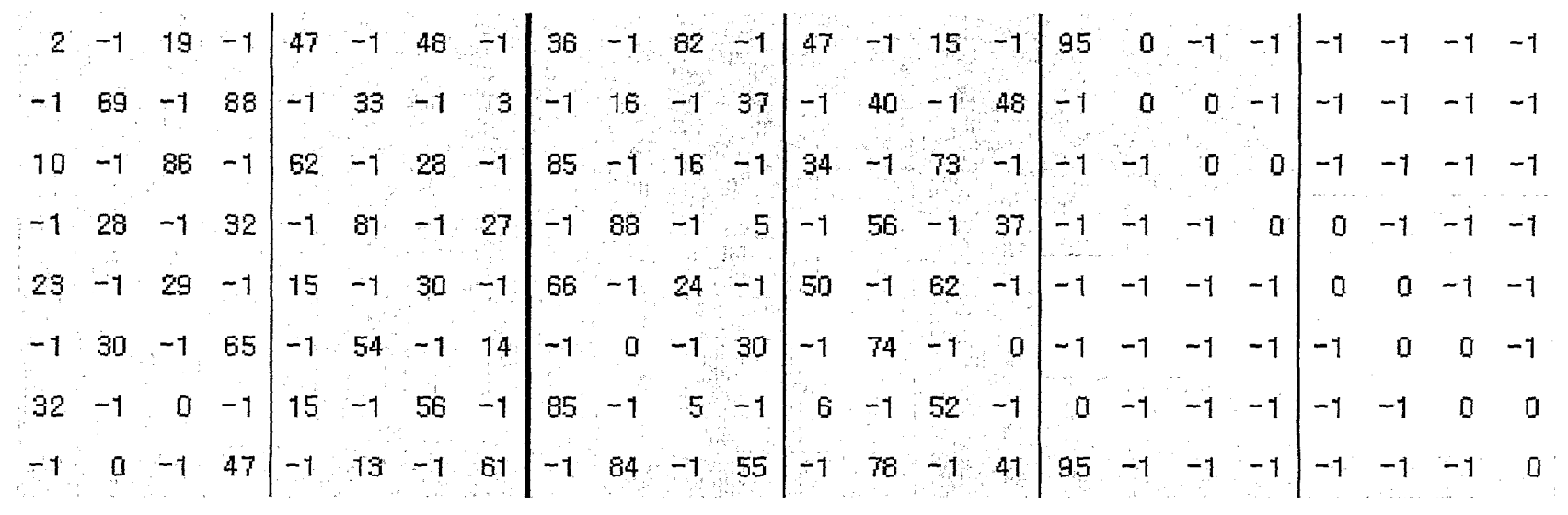

FIG. 14 illustrates an example of the general parity check matrix divided into six groups. Referring to FIG. 14, shaded portions represent that at least one component having a weight exists in a row within each group divided into six parts. The other portions which are not shaded represent that at least one component having no weight, i.e., only zero matrices exist in a row within each group divided into four parts. If the parity check matrix of FIG. 14 is divided into six groups having four row components, five portions corresponding to zero matrices exist in a row within each group. If a single row having four components is referred to as a set, the one group is comprised of eight sets while the whole parity check matrix is comprised of forty-eight sets. As described above, since the shuffled decoding performs check node update for each group, if the received signal is decoded using the parity check matrix of FIG. 14, the complicated calculation such as $$\prod_{n' \in N(m)} \tanh\left(\frac{z_{mn'}^{(i-1)}}{2}\right)$$

is required for forty-three sets of a total of forty-eight sets.

FIG. 15 illustrates an example of the parity check matrix according to one embodiment of the present invention, which is divided into six groups. Referring to FIG. 15, shaded portions represent that at least one component having a weight exists in a row within each group divided into six parts. The other portions which are not shaded represent that at least one component having no weight, i.e., only zero matrices exist in a row within each group divided into six parts. If the parity check matrix of FIG. 15 is divided into six groups having four row components, there exist twenty-one portions where components of each matrix correspond to zero matrices in a row within each group. Accordingly, if the received signal is decoded using the parity check matrix of FIG. 15, the complicated calculation such as $$\prod_{n' \in N(m)} \tanh\left(\frac{z_{mn'}^{(i-1)}}{2}\right)$$

is required for twenty-seven sets of a total of forty-eight sets. As a result, it is noted that decoding based on the parity check matrix according to one embodiment of the present invention is more advantageous than decoding based on the general parity check matrix of FIG. 14.

Figure 16:
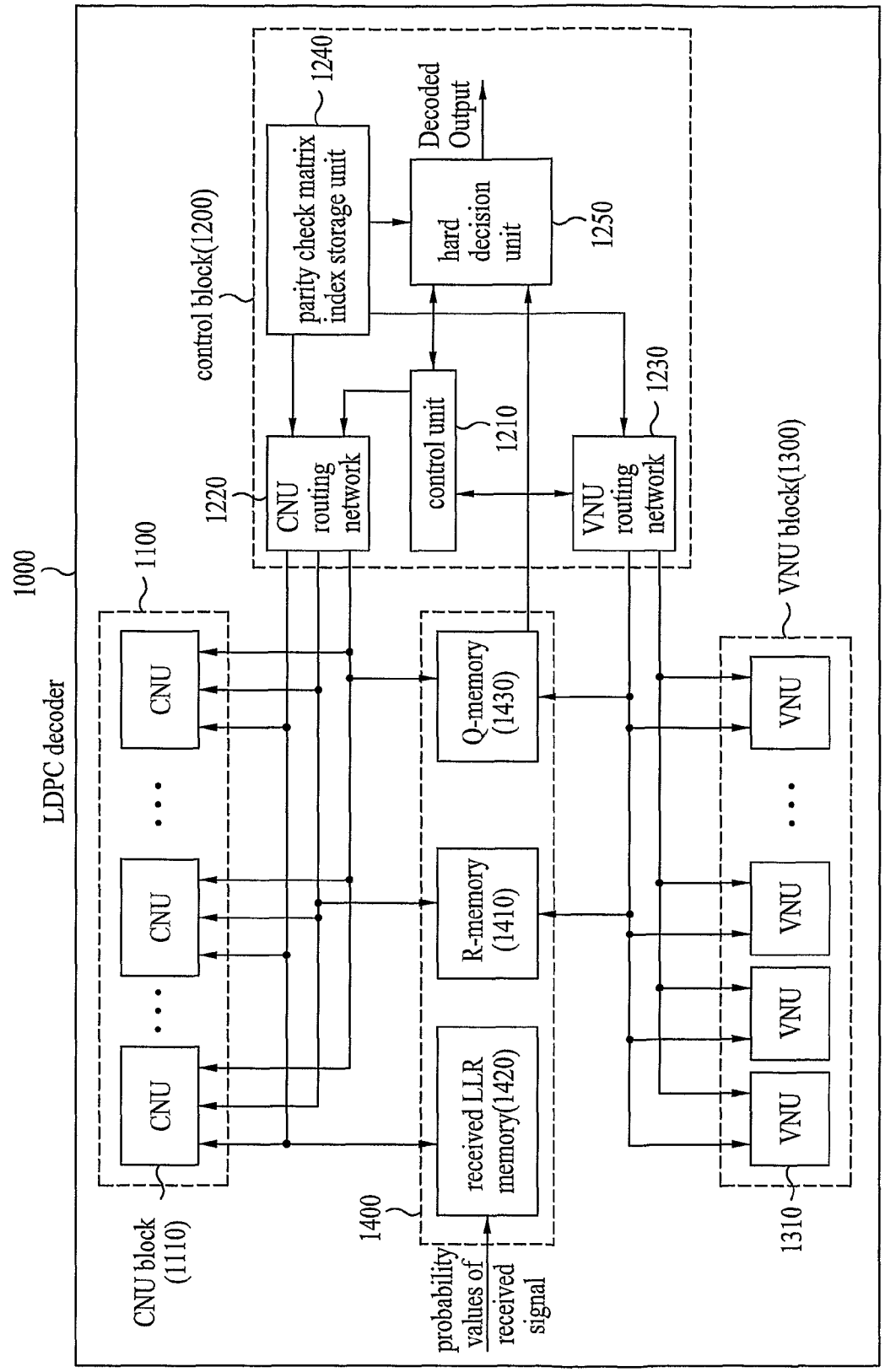
FIG. 16 is a block diagram illustrating an example of an LDPC decoder according to the present invention.

Hereinafter, an LDPC decoder which decodes an LDPC code using various base matrices suggested in the present invention will be described. FIG. 16 is a block diagram illustrating an example of an LDPC decoder according to the present invention. The LDPC decoder 1000 includes a check node update Unit (CNU) block 1100, a control block 1200, a variable node update Unit (VNU) block 1300, and a memory block 1400. The CNU block 1100 performs update of the probability values of check nodes (i.e., performs check node update), and includes at least one CNU 1110. The CNU 1110 is a processing unit that performs update of the probability values of the check nodes (check node update). The control block 1200 includes a control unit 1210, a CNU routing network 1220, a VNU routing network 1230, a parity check matrix index storage unit 1240, and a hard decision unit 1250. The control unit 1210 controls the operation of each unit of the decoder 1000. The CNU routing network 1220 controls the CNU block 1100 and the memory block 1400 in accordance with the structure of the parity check matrix. The VNU routing network 1230 controls the VNU block 1100 and the memory block 1400. The parity check matrix index storage unit 1240 stores information of the structure of the parity check matrix. The hard decision unit 1250 determines a decoding value using an updated probability value and checks the determined decoding value. The VNU block 1100 performs update of the probability values of variable nodes (i.e., performs variable node update), and includes at least one VNU 1310. The VNU 1310 is a processing unit that performs update of the probability values of the variable nodes (variable node update). The CNU 1110 and the VNU 1310 controlled by the control block 1200 calculate and update probability values of nonzero elements of the matrix H. The calculated probability values are stored in the memory block 1400. The memory block 1400 includes an R-memory 1410, a received log likelihood ratio (LLR) memory 1420, and a Q-memory 1430. The R-memory 1410 stores probability values calculated for check-to-variable node probability value update. The received LLR memory 1420 stores probability values (for example, LLR values received through a wireless channel) calculated for variable-to-check node probability value update. The Q-memory 1430 stores probability values calculated for variable-to-check node probability value update.

Each of the units will be described below in more detail. The received LLR memory 1420 stores probability values of a received signal to be decoded, for example, LLR values of a codeword of a received signal. The R-memory 1410 stores a result of probability value update at a specific check node (check node update), and the Q-memory 1430 stores a result of probability value update at a specific variable node (variable node update). The control unit 1210 controls the operation order of each unit and the operation timing thereof. The parity check matrix index storage unit 1240 stores information of the positions of weights, etc., of the parity check matrix. The CNU routing network 1220 acquires information of the parity check matrix from the parity check matrix index storage unit 1240 and appropriately connects the CNU 1110 to memories of the memory block 1400. The VNU routing network 1230 acquires information of the parity check matrix from the parity check matrix index storage unit 1240 and appropriately connects the VNU 1310 to the memories of the memory block 1400. The hard decision unit 1250 is a unit that determines a decoding value c' using the Q-memory 1430 and checks the determined decoding value c'. The hard decision unit 1250 outputs the decoding value c' as a true value if the decoding value c' satisfies a check equation $c'H^T=0$. By contrast, the hard decision unit 1250 iterates the decoding up to a specific maximum number of times if the decoding value c' does not satisfy the above check equation.

The decoder 1000 of FIG. 16 can decode the received signal using the parity check matrix stored in the parity check matrix index storage unit 1240 or a separate memory (not shown), or can decode the received signal using the parity check matrix generated using the base matrix and the base permutation matrix. In the case that the parity check matrix is generated using the base matrix and the base permutation matrix, the decoder 1000 preferably includes a storage unit (not shown) and a parity check matrix generator (not shown), wherein the storage unit stores the base matrix and the base permutation matrix and the parity check matrix generator generates the parity check matrix using the base matrix and the base permutation matrix. Also, the decoder 1000 of FIG. 16 can generate a new parity check matrix by adjusting the order of rows or columns of the parity check matrix. In this case, the decoder 1000 preferably includes a parity check matrix adjustor (not shown) that adjusts the order of rows or columns of the parity check matrix.

Figure 17:
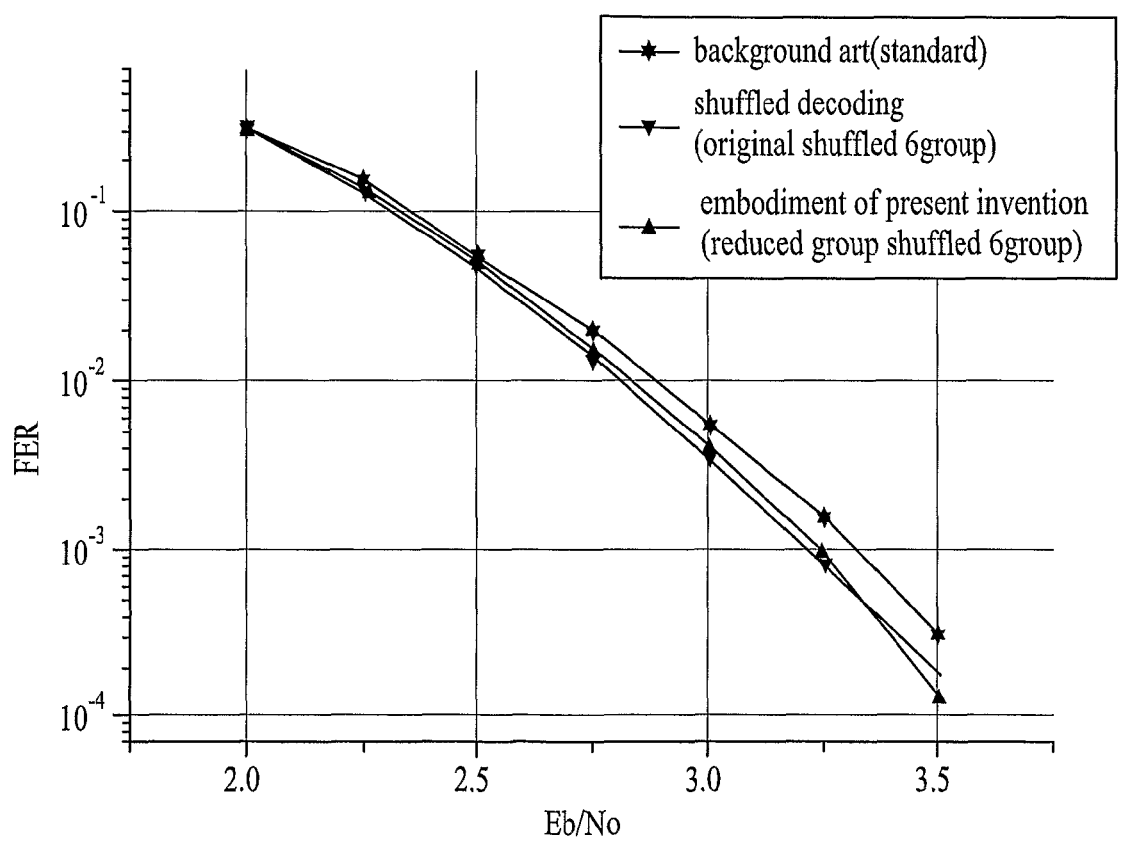
FIG. 17 illustrates improved performance in accordance with one embodiment of the present invention.

FIG. 17 illustrates improved performance in accordance with one embodiment of the present invention. As shown in FIG. 17, it is noted that the shuffled decoding of which decoding is performed using the parity check matrix divided into six groups has more excellent performance than performance of the conventional LDPC decoding algorithm. Also, it is noted that the shuffled decoding performed with increasing sets including zero matrices in a row has more excellent performance than performance of the conventional LDPC decoding algorithm. Furthermore, it is noted that there exists no special difference between performance obtained by the shuffled decoding performed with increasing sets including zero matrices in a row in accordance with one embodiment of the present invention and performance obtained by the shuffled decoding without adjusting the positions of the zero matrices. Accordingly, if decoding is performed using the parity check matrix according to one embodiment of the present invention, excellent performance can be maintained along with decrease in complexity of calculation.

Figure 18:
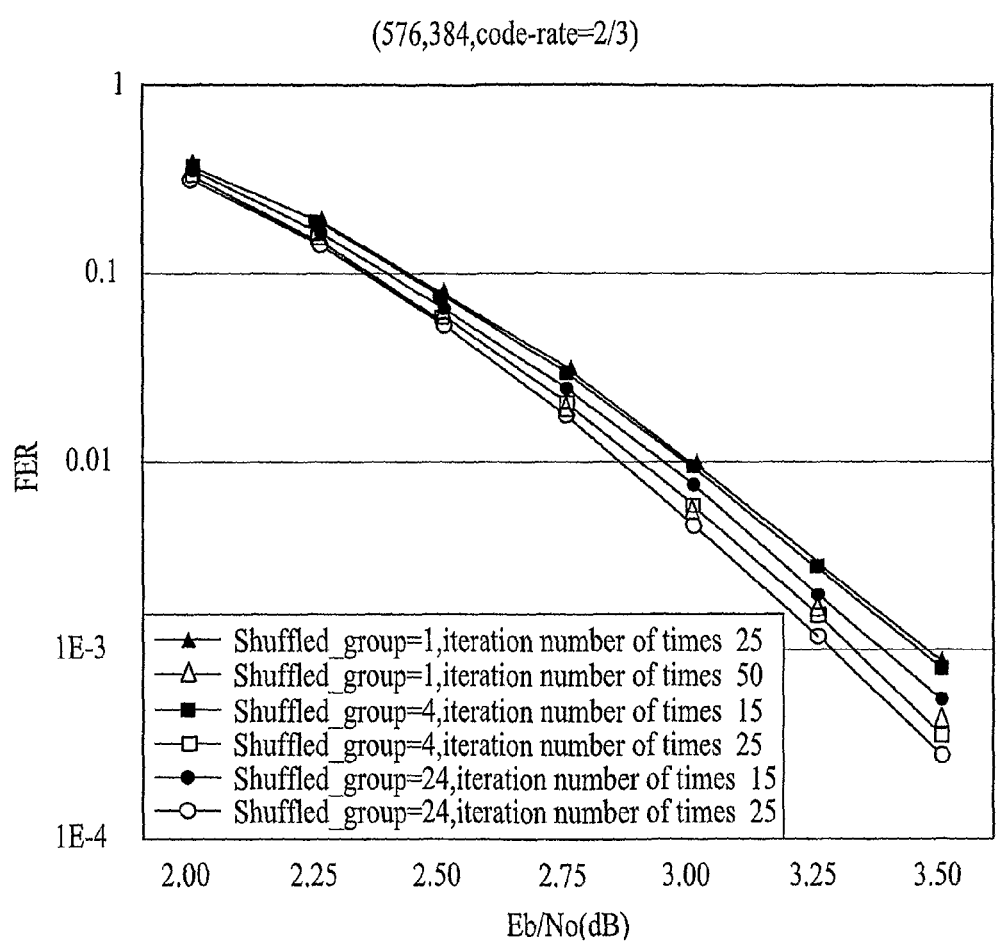
FIG. 18 illustrates another improved performance in accordance with one embodiment of the present invention.

FIG. 18 illustrates another improved performance in accordance with one embodiment of the present invention. Referring to FIG. 18, shuffled_group denotes the number of groups that divide the parity check matrix, the iteration number of times denote the iteration number of times for LDPC decoding. The result shown in FIG. 18 indicates that a code rate is ⅔. If the shuffled decoding is performed using the parity check matrix according to the embodiment of the present invention, performance can be improved as the number of shuffled_groups increases as shown in FIG. 18.

Figure 19:
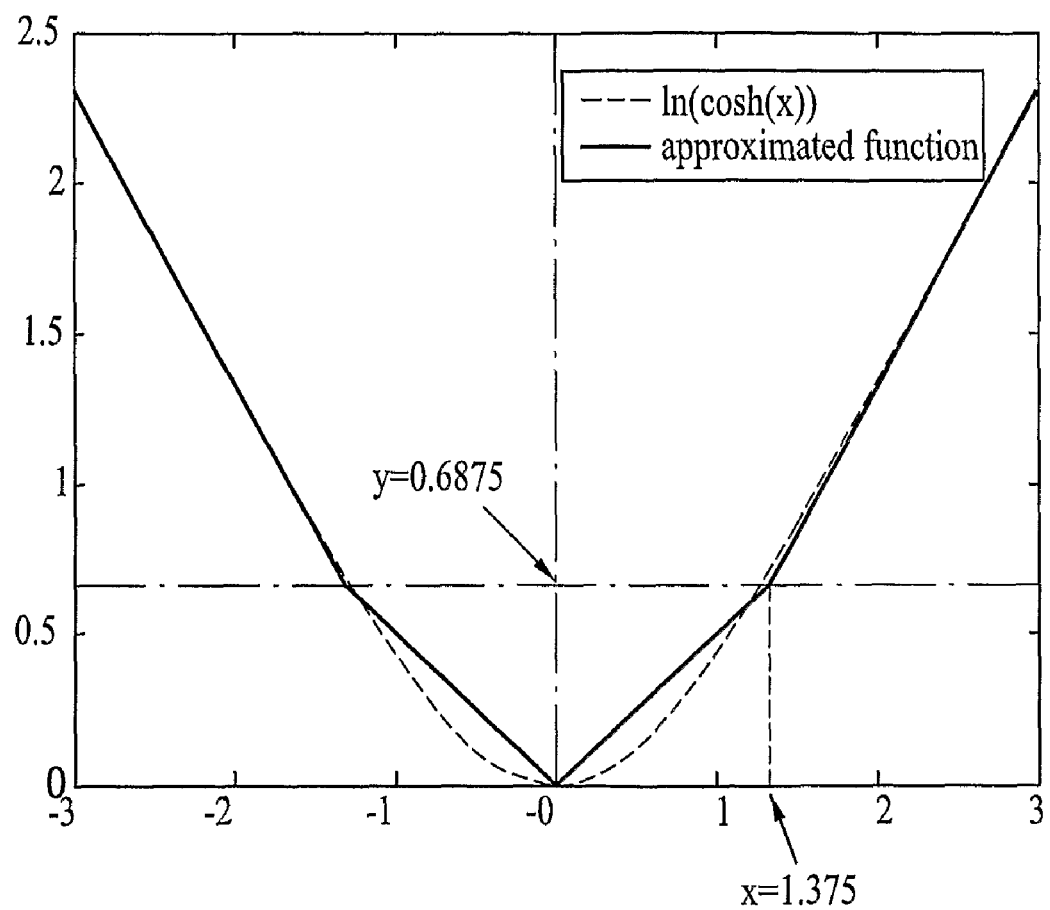
FIG. 19 illustrates another preferred embodiment of the present invention.

FIG. 19 illustrates a method for decoding an LDPC code in accordance with the preferred embodiment of the present invention. Referring to FIG. 19, the whole variable range of a nonlinear function ln(cosh(x)) is divided into four ranges to perform binary-to-check node probability value update, wherein different linear functions for each range approximate to the nonlinear function. In other words, in FIG. 19, a linear function y=|x|−0.6875 in a range of |x|≧1.375 and a liner function y=0.5|x| in a range of |x|<1.375 approximate to the nonlinear function ln(cosh(x)).

Figure 1:
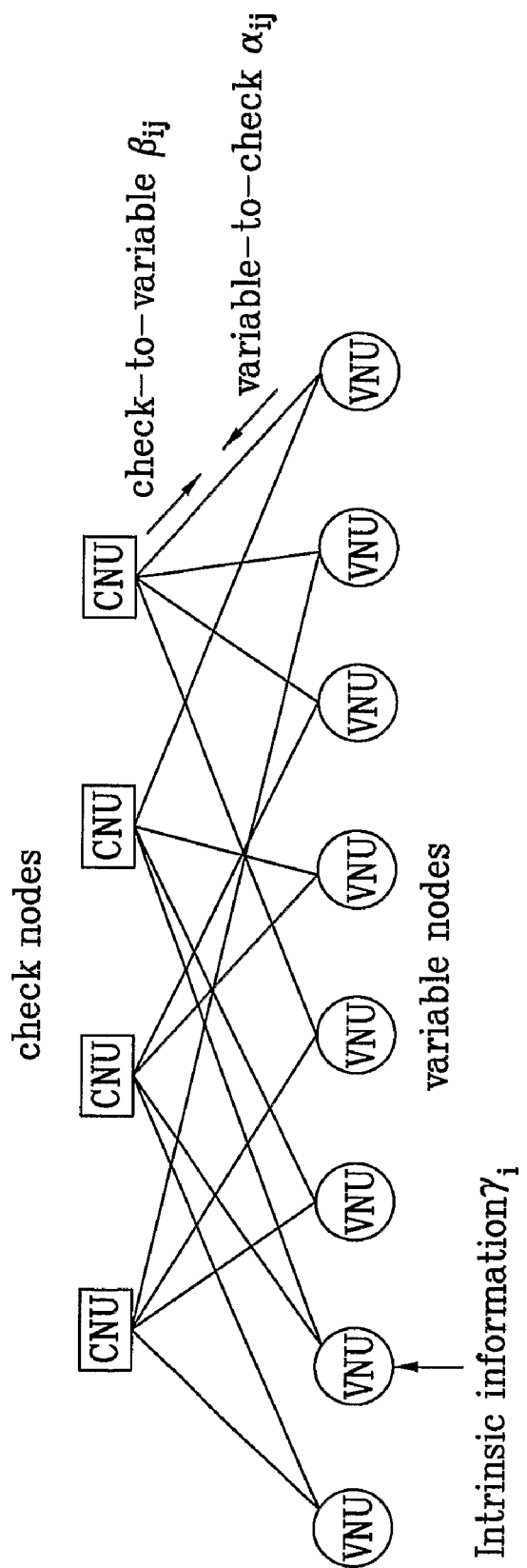
FIG. 1 illustrates a parity check matrix H through a bipartite graph.
Figure 2:
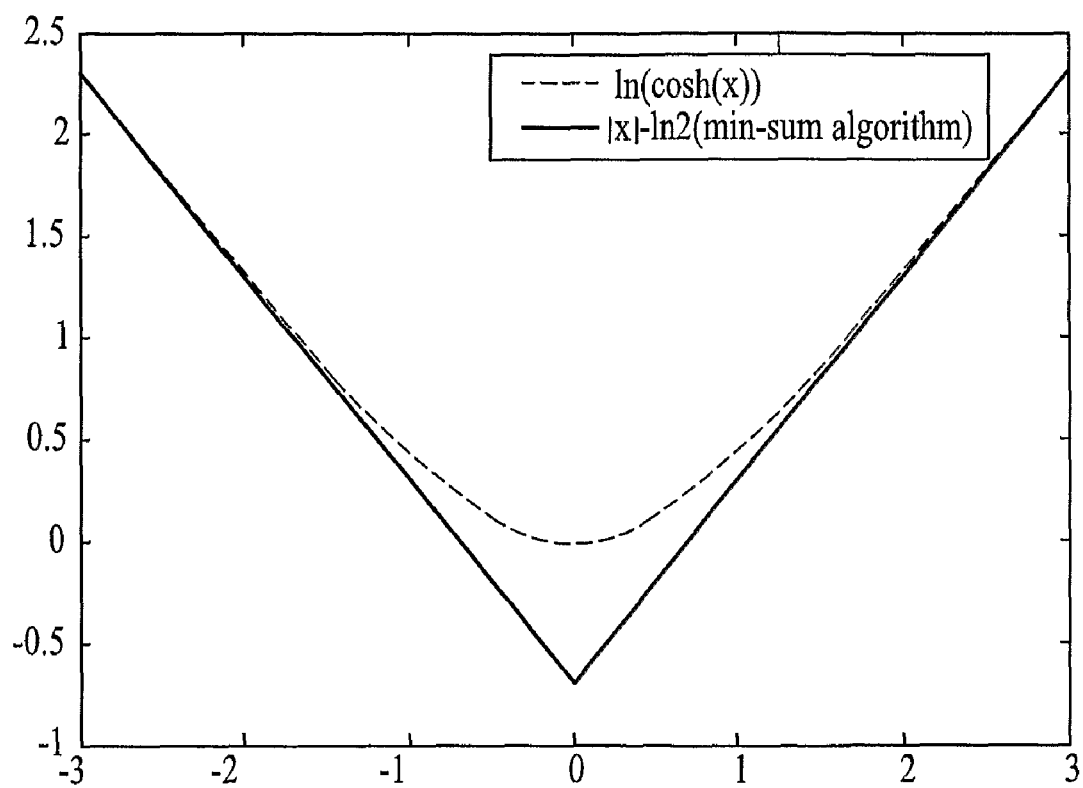
FIG. 2 illustrates a comparison result between an ideal function value and a function value obtained by a conventional min-sum algorithm.
Figure 3:
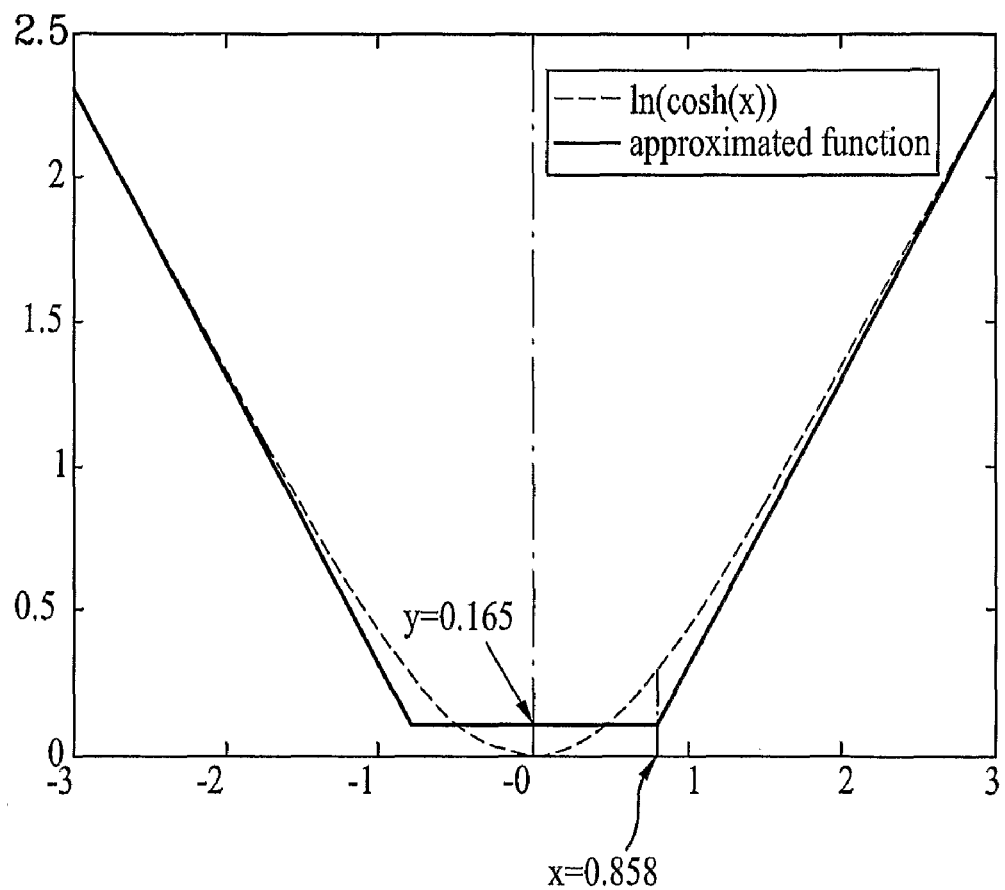
FIG. 3 to FIG. 5 illustrate a method for calculating a function value according to the conventional art.
Figure 4:
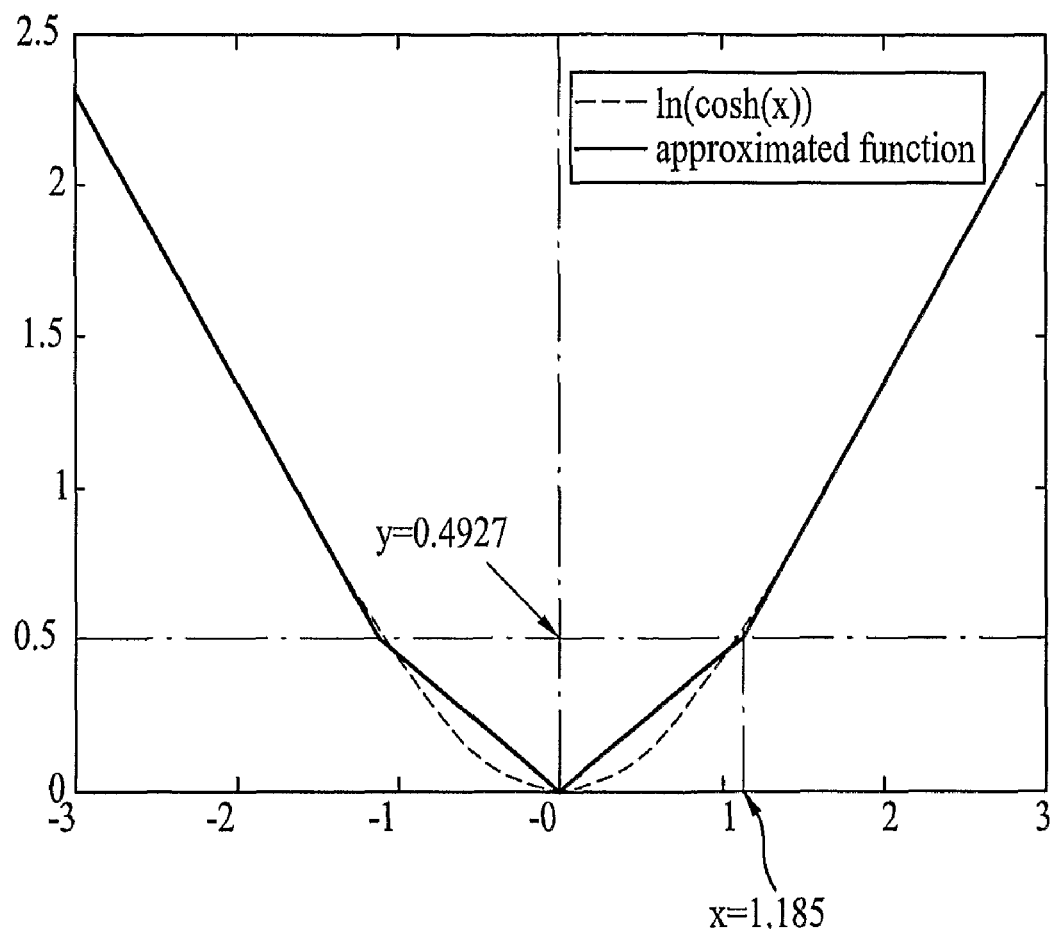
Figure 5:
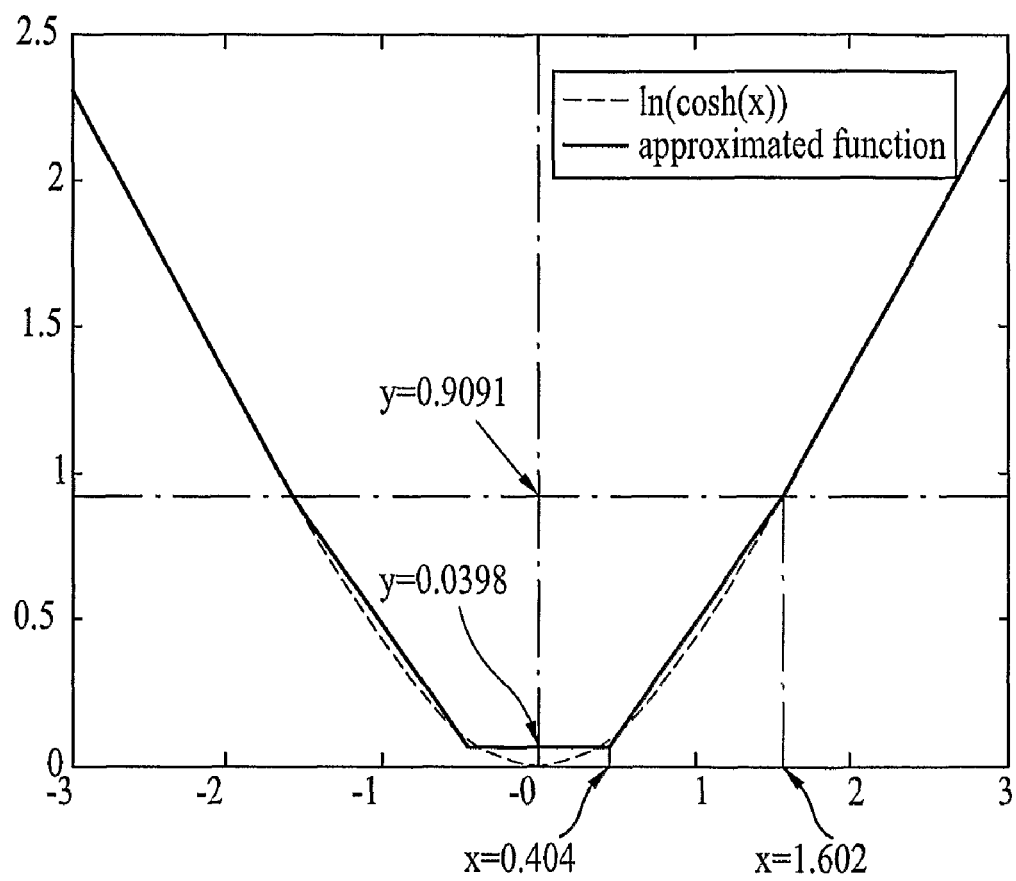

As described above with reference to the conventional art, multiplication according to a slope is required to calculate a function value in a nonlinear range (range of |x|<1.185 in FIG. 4 and range of 0.404<|x|<1.602 in FIG. 5). In this case, numbers of which absolute values can be expressed by an integer index of 2 can be calculated by simple shift only during multiplication or division. Accordingly, if the nonlinear function ln(cosh(x)) is approximated by combination of linear functions having a slope of which absolute values can be expressed by an integer index of 2, calculation can be performed with complexity remarkably lower than that of an approximation function having a slope of which absolute values cannot be expressed by an integer index of 2. In view of characteristic of the function ln(cosh(x)), excellent decoding performance can be obtained by an approximation function having a slope of 0 or an integer index of 2.

Multiplication of $0.5(=2^{-1})$ to a variable value is the same as the result obtained by shifting the variable value to the right by 1 bit, and 0.6875 and 1.375 can be quantized by a small number of bits such as $0.1011_{(2)}$ and $1.0110_{(2)}$, whereby approximation can be performed with low complexity. Numbers that can be combined with one another by a small number of bits as below are preferably used as constant values used for approximation. In the following, bits expressed following each number are minimum bits required to express their quantized numbers.

$$0.5\ (2^{-1}) = 0.1_{(2)}\ - 1\text{ bit}$$
$$0.25\ (2^{-2}) = 0.01_{(2)}\ - 2\text{ bits}$$
$$0.125\ (2^{-3}) = 0.001_{(2)}\ - 3\text{ bits}$$
$$0.0625\ (2^{-4}) = 0.0001_{(2)}\ - 4\text{ bits}$$
$$0.03125\ (2^{-5}) = 0.00001_{(2)}\ - 5\text{ bits}$$

. . .

Furthermore, although the nonlinear function ln(cosh(x)) is approximated to the linear function y=|x|−ln2 in a linear range |x|>>1 in accordance with the conventional art, a number the nearest to a constant value ln2 is preferably used, for simple calculation, in accordance with bits used for quantization of the constant value ln2. For example, if 4 bits are used for quantization of numbers less than a decimal point, the constant value is approximated to y=|x|−0.6875 using 0.6875 the nearest to ln2(=0.693147) among numbers that can be expressed by 4 bits.

If two message values $\Lambda_1$, $\Lambda_2$ are input, values corresponding to ½ of sum and difference between the two message values are obtained respectively. The value corresponding to ½ of the sum between the two message values is equal to $(\Lambda_1+\Lambda_2)/2$ while the value corresponding to ½ of the difference between the two message values is equal to $(\Lambda_1-\Lambda_2)/2$. The obtained two values are used as variable values "x" so that a function value is calculated using a linear function given for each range in accordance with ranges to which each variable value belongs. In other words, in FIG. 19, if an absolute value of each variable value is smaller than 1.375, the function value is calculated by calculation of y=0.5|x|. By contrast, if the absolute value of each variable value is greater than 1.375, the function value is calculated by calculation of y=|x|−0.6875. This can be expressed by the following equation.

$$ln(\cosh(x))\approx|x|-0.6875, |x|\geqq 1.375 \approx 0.5|x|, |x|<1.375 \quad [\text{Equation 5}]$$

If the difference between the two function values calculated as above is obtained, check function values CHK ($\Lambda_1$, $\Lambda_2$) are obtained by the equation 4, and the obtained values CHK ($\Lambda_1$, $\Lambda_2$) finally become the probability values updated from the check node to the variable node.

If input message values are more than three, the function values CHK ($\Lambda_1$, $\Lambda_2$) obtained as above with respect to the first and second message values are regarded as one message value, and the above process is recurrently iterated with respect to a third message value $\Lambda_3$ and CHK ($\Lambda_1$, $\Lambda_2$). For example, if there exists four input message values, first and second input messages are applied to the check functions CHK ($\Lambda_1$, $\Lambda_2$) using the approximation equation of the equation 5 to obtain a first output value. Then, a third input message value $\Lambda_3$ and the first output value CHK($\Lambda_1$, $\Lambda_2$) are applied to CHK[$\Lambda_3$, CHK($\Lambda_1$, $\Lambda_2$)] using the approximation equation of the equation 5 to obtain a second output value. Finally, a fourth input message value $\Lambda_4$ and the second output value CHK[$\Lambda_3$, CHK($\Lambda_1$, $\Lambda_2$)] are applied to the check function CHK{$\Lambda_4$, CHK[$\Lambda_3$, CHK($\Lambda_1$, $\Lambda_2$)]} to obtain a third output value.

Figure 20:
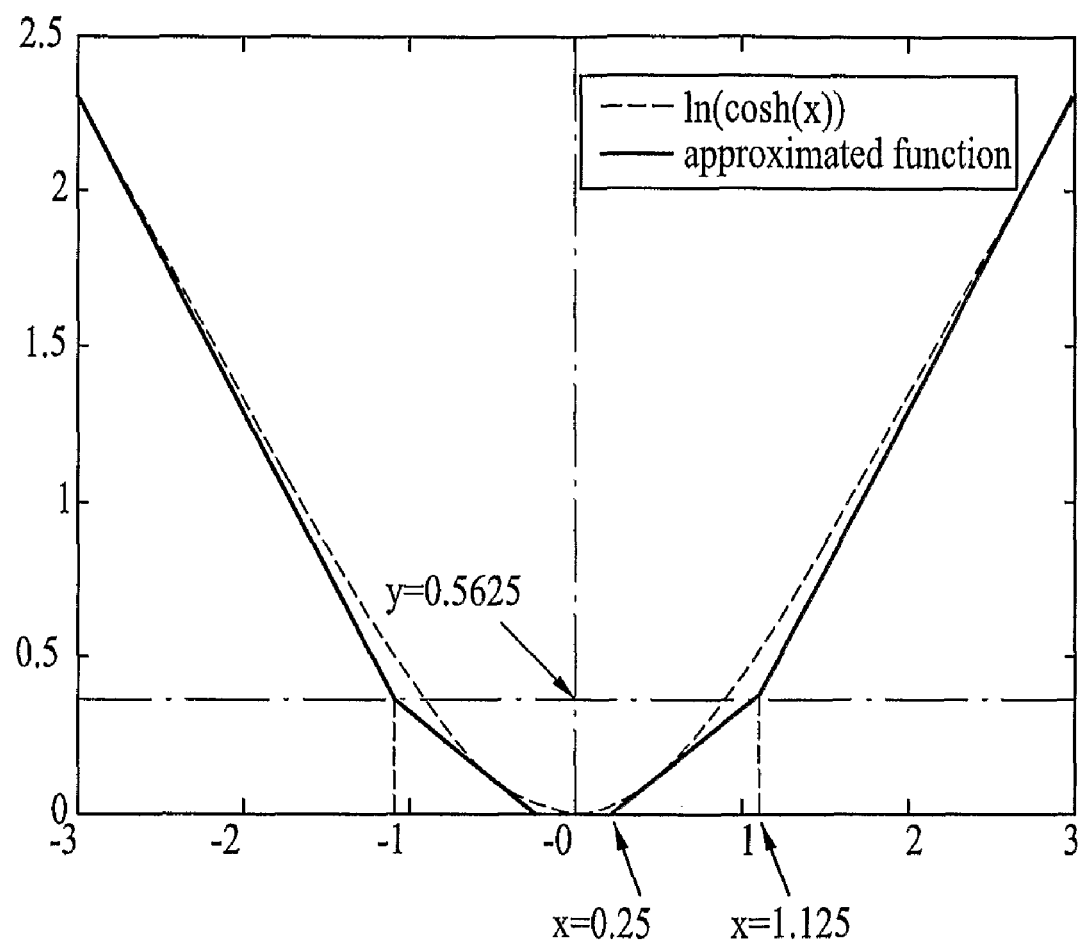
FIG. 20 illustrates another preferred embodiment of the present invention.

FIG. 20 illustrates another preferred embodiment of the present invention. Referring to FIG. 20, the whole variable range of the nonlinear function ln(cosh(x)) is divided into five ranges, wherein different linear functions for each range approximate to the nonlinear function. Referring to FIG. 20, when a constant value of the linear function approximated in a linear range |x|≧1.125 is equal to 0.6875 the nearest to ln2 when numbers less than a decimal point are quantized by 4 bits, and a slope of the linear function approximated in a nonlinear range |x|<1.125 is equal to either an integer index $(2^{-1})$ of 2 or 0. The linear function approximated in accordance with the embodiment of FIG. 20 can be expressed by the following equation.

$$ln(\cosh(x)) \approx |x| - 0.6875,\ |x| \geq 1.125 \approx 0.5|x| - 0.125, \quad [\text{Equation 6}]$$
$$0.25 < |x| < 1.125 \approx 0|x| \leq 0.25$$

In the embodiment of FIG. 20, when two message values $\Lambda_1$, $\Lambda_2$ or three or more message values are input, the probability value update procedure is performed in the same manner as that described in the embodiment of FIG. 19 excluding the number of divided ranges and the linear function approximated for each range. Accordingly, the detailed description of the probability value update procedure according to the embodiment of FIG. 20 will be omitted.

Figure 21:
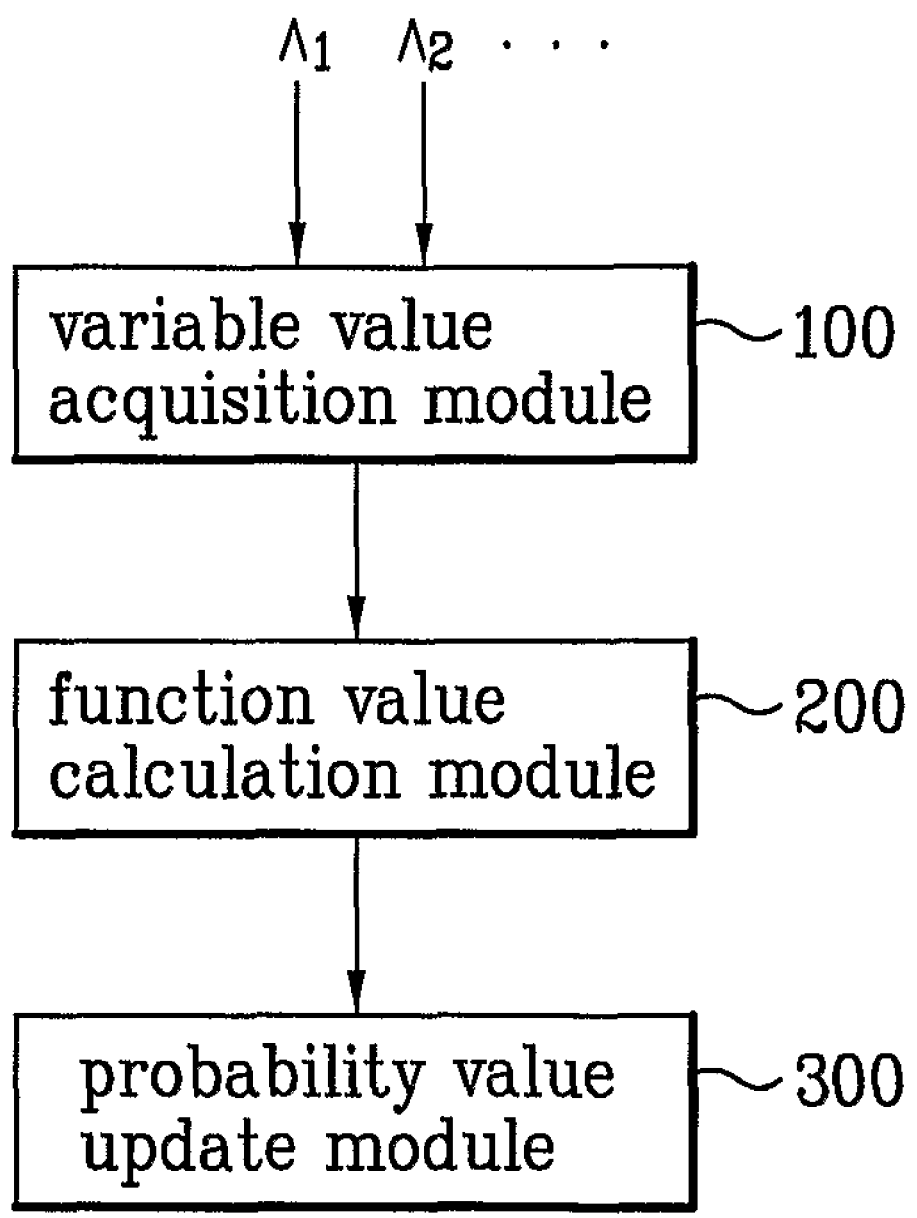
FIG. 21 is a schematic view illustrating an apparatus for decoding an LDPC code according to the preferred embodiment of the present invention.

FIG. 21 is a schematic view illustrating an apparatus for decoding an LDPC code according to the preferred embodiment of the present invention. The apparatus includes a variable value acquisition module 100, a function value calculation module 200, and a probability value update module 300. The variable value acquisition module 100 calculates two input messages to acquire variable values. The function value calculation module 200 calculates a function value of each variable value in accordance with a linear function of a range to which each variable value belongs, by using a linear function for each range selected to approximate to a specific nonlinear function, wherein each range is obtained by dividing the whole variable range into three or more parts, and the linear function in a specific range corresponding to $|x|<a$ is $b|x|+d$ (b and d are constants) and b is an integer index of 2 ($2^m$, m is an integer). The probability value update module 300 updates probability values using the calculated function values. These modules of the decoding apparatus function as described through the preferred embodiments of the present invention, and it will be apparent that these modules can be implemented by software, hardware, or combination of them. Also, although the respective modules are shown as being physically separated from one another in FIG. 21, they may be implemented in a single module by software, hardware, or combination of them.

According to the present invention, decoding complexity can be reduced in the maximum range of 40% without degradation of performance in comparison with the parity check matrix of the conventional LDPC encoding.

Furthermore, according to the present invention, complexity of calculation can be reduced in comparison with the conventional algorithm, and at the same time excellent performance can be obtained. In other words, if the linear function is approximated using the slope and the constant value suggested by the present invention, the calculation amount, i.e., complexity can be reduced considerably.

Figure 22:
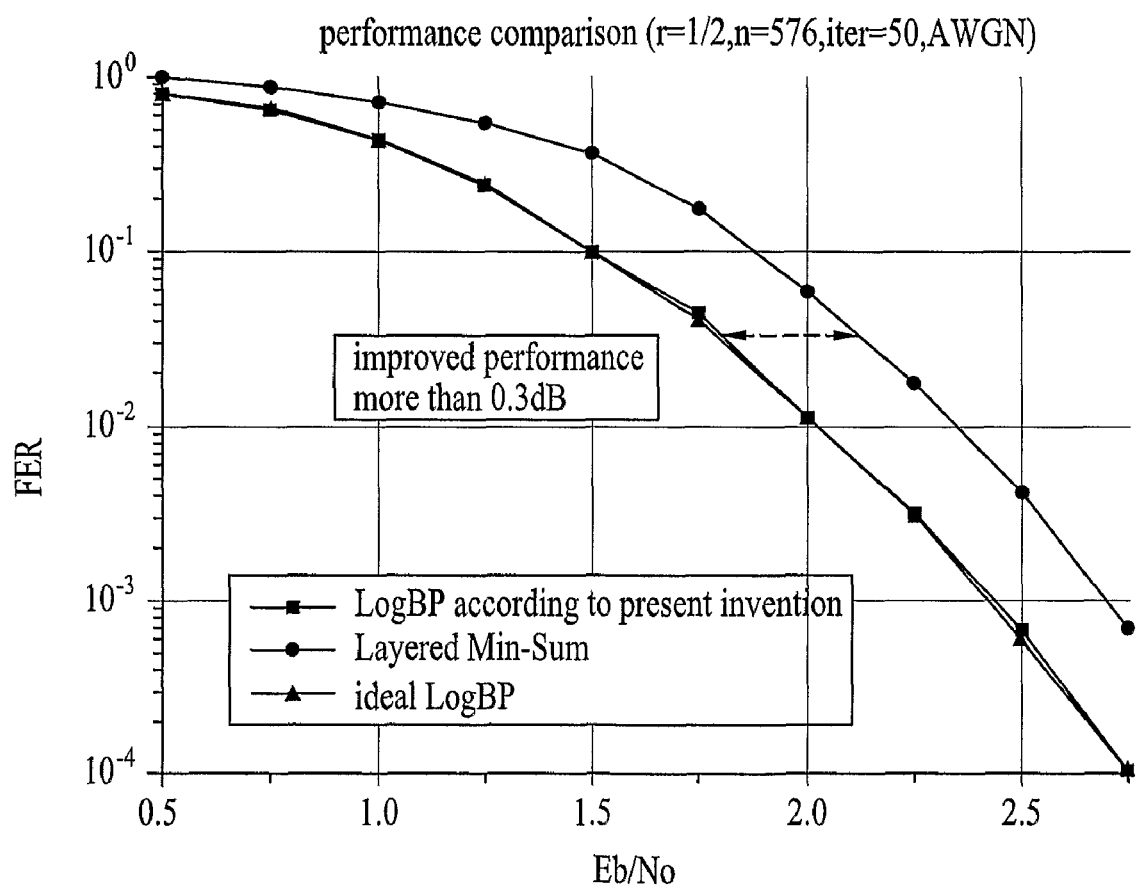
FIG. 22 is a performance graph under the same condition that a code rate is ½ and a code-length is 576 bits.

FIG. 22 is a performance graph under the same condition that a code rate is ½ and a code-length is 576 bits. Referring to FIG. 22, performance of the decoder using the ideal function $\ln(\cosh(x))$, performance of the decoder using the approximation function suggested by the present invention, and performance of the decoder using the min-sum algorithm are compared with one another. It is noted that performance almost similar to that obtained using the ideal function can be obtained if the method suggested by the present invention is used.

It will be apparent to those skilled in the art that the present invention can be embodied in other specific forms without departing from the spirit and essential characteristics of the invention. Thus, the above embodiments are to be considered in all respects as illustrative and not restrictive. The scope of the invention should be determined by reasonable interpretation of the appended claims and all change which comes within the equivalent scope of the invention are included in the scope of the invention.

INDUSTRIAL APPLICABILITY

The technical features of the present invention can be applied to communication systems such as a mobile communication system or a wireless Internet system, which require channel encoding or decoding.

What is claimed is:

1. A method for decoding signals by using a channel code, the method comprising:
receiving signals encoded using a first parity check matrix of a low density parity check (LDPC) code, the first parity check matrix consisting of a plurality of z-by-z zero matrices and a plurality of z-by-z permutation matrices, wherein each of the plurality of z-by-z permutation matrices is formed by shifting each row or each column of a z-by-z identity matrix by a shift number in a specific direction, wherein z is a positive integer, and wherein the shift number is a non-negative integer;
generating a second parity check matrix by adjusting the order of rows or columns of the first parity check matrix, wherein the second parity check matrix is divided into X groups, each of the X groups consisting of a Y columns, wherein X is a positive integer larger than 1, wherein Y is a positive integer larger than 1, wherein a number of columns of the second parity check matrix is equal to X*Y, and wherein at least one of the X groups includes at least one row of which every element is zero (0); and
iteratively decoding the received signals for each of the X groups by using the second parity check matrix.

2. The method as claimed in claim 1, wherein iteratively decoding the received signals comprises:
calculating a probability value of the received signals for each of the X groups by using the second parity check matrix; and
determining a decoding value by using the calculated probability value.

3. The method as claimed in claim 2, wherein of iteratively decoding the received signals further comprises checking whether the determined decoding value is an accurately received value.

4. The method as claimed in claim 1, wherein:
the second parity check matrix has a form of $[H_d|H_p]$;
$H_p$ denotes a block double diagonal matrix; and
$H_d$ includes the at least one of the X groups including the at least one row.

5. The method as claimed in claim 1, wherein:
the first parity check matrix is:

| 2 | −1 | 19 | −1 | 47 | −1 | 48 | −1 | 36 | −1 | 82 | −1 | 47 | −1 | 15 | −1 | 95 | 0 | −1 | −1 | −1 | −1 | −1 | −1 |
|---|---|---|---|---|---|---|---|---|---|---|---|---|---|---|---|---|---|---|---|---|---|---|---|
| −1 | 69 | −1 | 86 | −1 | 33 | −1 | 3 | −1 | 16 | −1 | 37 | −1 | 40 | −1 | 48 | −1 | 0 | 0 | −1 | −1 | −1 | −1 | −1 |
| 10 | −1 | 86 | −1 | 62 | −1 | 28 | −1 | 85 | −1 | 16 | −1 | 34 | −1 | 73 | −1 | −1 | −1 | 0 | 0 | −1 | −1 | −1 | −1 |
| −1 | 28 | −1 | 32 | −1 | 81 | −1 | 27 | −1 | 88 | −1 | 5 | −1 | 56 | −1 | 37 | −1 | −1 | −1 | 0 | 0 | −1 | −1 | −1 |
| 23 | −1 | 29 | −1 | 15 | −1 | 30 | −1 | 66 | −1 | 24 | −1 | 50 | −1 | 62 | −1 | −1 | −1 | −1 | −1 | 0 | 0 | −1 | −1 |
| −1 | 30 | −1 | 65 | −1 | 54 | −1 | 14 | −1 | 0 | −1 | 38 | −1 | 74 | −1 | 0 | −1 | −1 | −1 | −1 | −1 | 0 | 0 | −1 |
| 32 | −1 | 0 | −1 | 15 | −1 | 56 | −1 | 85 | −1 | 5 | −1 | 6 | −1 | 52 | −1 | 0 | −1 | −1 | −1 | −1 | −1 | 0 | 0 |
| −1 | 0 | −1 | 47 | −1 | 13 | −1 | 61 | −1 | 84 | −1 | 55 | −1 | 78 | −1 | 41 | 95 | −1 | −1 | −1 | −1 | −1 | −1 | 0; |

'−1' in the first parity check matrix denotes a z-by-z zero matrix; and
each non-negative integer in the first parity check matrix denotes a z-by-z permutation matrix generated by shifting each row or each column of the z-by-z identity matrix by a corresponding non-negative integer in the specific direction.

6. An apparatus for decoding signals by using a channel code, the apparatus comprising:

a receiving module for receiving signals encoded using a first parity check matrix of a low density parity check (LDPC) code, the first parity check matrix consisting of a plurality of z-by-z zero matrices and a plurality of z-by-z permutation matrices, wherein each of the plurality of z-by-z permutation matrices is formed by shifting each row or each column of a z-by-z identity matrix by a shift number in a specific direction, wherein z is a positive integer, and wherein the shift number is a non-negative integer;

a parity check matrix generation module for generating a second parity check matrix by adjusting the order of rows or columns of the first parity check matrix, wherein the second parity check matrix is divided into X groups, each of the X groups consisting of Y columns, wherein X is a positive integer larger than 1, wherein Y is a positive integer larger than 1, wherein a number of columns of the second parity check matrix is equal to X*Y, and wherein at least one of the X groups includes at least one row of which every element is zero (0); and a decoding module for iteratively decoding the received signals for each of the X groups by using the second parity check matrix.

7. The apparatus as claimed in claim 6, wherein the decoding module comprises:
at least one check node update unit for performing a check node update of the received signals for each of the X groups by using the second parity check matrix;
at least one variable node update unit for performing a variable node update of the received signals by using the second parity check matrix; and
a decoding value determination module for determining a decoding value by using the updated received signals.

8. The apparatus as claimed in claim 7, wherein the decoding module further comprises a check module for checking whether the determined decoding value is an accurately received value.

9. The apparatus as claimed in claim 6, wherein:
the second parity check matrix has a form of $[H_d|H_p]$;
$H_p$ is a block double diagonal matrix; and
$H_d$ includes the at least one of the X groups including the at least one row.

10. The apparatus as claimed in claim 6, wherein:
the first parity check matrix is:

11. A method for encoding data using a low density parity check (LDPC) code, the method comprising:
generating a second parity check matrix by adjusting the order of rows or columns of a first parity check matrix;
encoding data to be transmitted, by using the generated second parity check matrix; and
transmitting the encoded data,
wherein the first parity check matrix consists of a plurality of z-by-z zero matrices and a plurality of z-by-z permutation matrices,
wherein each of the plurality of z-by-z permutation matrices is formed by shifting each row or each column of a z-by-z identity matrix by a shift number in a specific direction,
wherein z is a positive integer,
wherein the shift number is a non-negative integer,
wherein the second parity check matrix is divided into X groups, each of the X groups consisting of Y columns,
wherein X is a positive integer larger than 1,
wherein Y is a positive integer larger than 1,
wherein a number of columns of the second parity check matrix is equal to X*Y, and
wherein at least one of the X groups includes at least one row of which every element is zero (0).

12. An apparatus for encoding data using a channel code, the apparatus comprising:
a parity check matrix generation module for generating a second parity check matrix by adjusting the order of rows or columns of a first parity check matrix;
an encoding module for encoding data to be transmitted, by using the second parity check matrix; and
a transmitting module for transmitting the encoded data,
wherein the first parity check matrix consists of a plurality of z-by-z zero matrices and a plurality of z-by-z permutation matrices,
wherein each of the plurality of z-by-z permutation matrices is formed by shifting each row or each column of a z-by-z identity matrix by a shift number in a specific direction,
wherein z is a positive integer,
wherein the shift number is a non-negative integer,
wherein the second parity check matrix is divided into X groups, each of the X groups consisting of Y columns,
wherein X is a positive integer larger than 1,

| 2 | −1 | 19 | −1 | 47 | −1 | 48 | −1 | 36 | −1 | 82 | −1 | 47 | −1 | 15 | −1 | 95 | 0 | −1 | −1 | −1 | −1 | −1 | −1 |
|---|---|---|---|---|---|---|---|---|---|---|---|---|---|---|---|---|---|---|---|---|---|---|---|
| −1 | 69 | −1 | 86 | −1 | 33 | −1 | 3 | −1 | 16 | −1 | 37 | −1 | 40 | −1 | 48 | −1 | 0 | 0 | −1 | −1 | −1 | −1 | −1 |
| 10 | −1 | 86 | −1 | 62 | −1 | 28 | −1 | 85 | −1 | 16 | −1 | 34 | −1 | 73 | −1 | −1 | −1 | 0 | 0 | −1 | −1 | −1 | −1 |
| −1 | 28 | −1 | 32 | −1 | 81 | −1 | 27 | −1 | 88 | −1 | 5 | −1 | 56 | −1 | 37 | −1 | −1 | −1 | 0 | 0 | −1 | −1 | −1 |
| 23 | −1 | 29 | −1 | 15 | −1 | 30 | −1 | 66 | −1 | 24 | −1 | 50 | −1 | 62 | −1 | −1 | −1 | −1 | −1 | 0 | 0 | −1 | −1 |
| −1 | 30 | −1 | 65 | −1 | 54 | −1 | 14 | −1 | 0 | −1 | 38 | −1 | 74 | −1 | 0 | −1 | −1 | −1 | −1 | −1 | 0 | 0 | −1 |
| 32 | −1 | 0 | −1 | 15 | −1 | 56 | −1 | 85 | −1 | 5 | −1 | 6 | −1 | 52 | −1 | 0 | −1 | −1 | −1 | −1 | −1 | 0 | 0 |
| −1 | 0 | −1 | 47 | −1 | 13 | −1 | 61 | −1 | 84 | −1 | 55 | −1 | 78 | −1 | 41 | 95 | −1 | −1 | −1 | −1 | −1 | −1 | 0; |

'−1' in the first parity check matrix denotes a z-by-z zero matrix; and
each non-negative integer in the first parity check matrix denotes a z-by-z permutation matrix generated by shifting each row or each column of the z-by-z identity matrix by a corresponding non-negative integer in the specific direction.

wherein Y is a positive integer larger than 1,
wherein a number of columns of the second parity check matrix is equal to X*Y, and
wherein at least one of the X groups includes at least one row of which every element is zero (0).

* * * * *